US009846091B2

(12) United States Patent
Lu et al.

(10) Patent No.: US 9,846,091 B2
(45) Date of Patent: Dec. 19, 2017

(54) SYSTEMS AND METHODS FOR PRESS FORCE DETECTORS

(71) Applicant: Interlink Electronics, Inc., Westlake Village, CA (US)

(72) Inventors: Chee Wai Lu, Singapore (MY); Jeffrey R. Baker, Thousand Oaks, CA (US); Edwin Keshesh Yousafian, Tujunga, CA (US); Declan Christopher Flannery, Venice, CA (US)

(73) Assignee: INTERLINK ELECTRONICS, INC., Westlake Village, CA (US)

( * ) Notice: Subject to any disclaimer, the term of this patent is extended or adjusted under 35 U.S.C. 154(b) by 0 days.

(21) Appl. No.: 15/402,535

(22) Filed: Jan. 10, 2017

(65) Prior Publication Data
US 2017/0131160 A1    May 11, 2017

Related U.S. Application Data

(63) Continuation-in-part of application No. 14/987,907, filed on Jan. 5, 2016, now Pat. No. 9,574,954, which
(Continued)

(51) Int. Cl.
*G01L 1/00* (2006.01)
*G01L 1/16* (2006.01)
(Continued)

(52) U.S. Cl.
CPC ............. *G01L 1/16* (2013.01); *G01L 5/0052* (2013.01); *G01L 9/065* (2013.01); *G06F 3/044* (2013.01);
(Continued)

(58) Field of Classification Search
CPC ......... G01L 1/16; G01L 5/0052; G01L 9/065; G06F 3/0418; G06F 3/044; G06F 2203/04105
(Continued)

(56) References Cited

U.S. PATENT DOCUMENTS 4,634,917 A    1/1987    Dvorsky
4,649,312 A    3/1987    Robin
(Continued)

OTHER PUBLICATIONS

"Piezo Film Sensors, Technical Manual" Measurement Specialties, Inc, P/N 1005663-1 REV E Mar. 25, 2008.

*Primary Examiner* — Max Noori
(74) *Attorney, Agent, or Firm* — Troutman Sanders LLP

(57) ABSTRACT

Certain example embodiments include a press sensor element that includes a piezoelectric layer having a first surface in communication with a first layer, the first layer including a first conductive region, where the first conductive region covers at least a central portion the first surface. The sensor element includes a second surface in communication with a second layer, the second layer including a second conductive region, a third conductive region, and a first non-conductive void region separating the second conductive region and the third conductive region. An area of the first conductive region is configured in size relative to an area of the third conductive region to substantially reduce a thermally-induced voltage change between two or more of the first, second, and third conductive regions responsive to a corresponding temperature change of at least a portion of the piezoelectric layer.

20 Claims, 18 Drawing Sheets

Related U.S. Application Data is a continuation-in-part of application No. 14/204,217, filed on Mar. 11, 2014, now Pat. No. 9,261,418.

(60) Provisional application No. 61/777,231, filed on Mar. 12, 2013.

(51) Int. Cl.
| | | |
|---|---|---|
| *G01L 5/00* | (2006.01) | |
| *G01L 9/06* | (2006.01) | |
| *G06F 3/044* | (2006.01) | |
| *G06F 3/041* | (2006.01) | |

(52) U.S. Cl.
CPC .. *G06F 3/0418* (2013.01); *G06F 2203/04105* (2013.01)

(58) Field of Classification Search
USPC ..................................................... 73/862.68
See application file for complete search history.

(56) References Cited

U.S. PATENT DOCUMENTS

| | | | |
|---|---|---|---|
| 4,906,840 | A | 3/1990 | Zdeblick et al. |
| 5,446,334 | A * | 8/1995 | Gaffney .............. H01L 41/1132 250/338.3 |
| 5,856,644 | A | 1/1999 | Burgess |
| 7,618,188 | B2 * | 11/2009 | Glaser ...................... G01L 1/16 374/197 |
| 8,822,251 | B2 | 9/2014 | Yamaguchi |
| 2006/0076851 | A1 * | 4/2006 | Fujimoto ................ H03H 3/08 310/313 R |
| 2007/0236107 | A1 | 10/2007 | Maruyama et al. |
| 2008/0224566 | A1 | 9/2008 | Bharti et al. |
| 2012/0280594 | A1 * | 11/2012 | Chen ..................... H03H 3/007 310/313 R |
| 2013/0205582 | A1 | 8/2013 | Singh et al. |
| 2015/0247766 | A1 * | 9/2015 | Yang ...................... G01L 5/228 73/862.627 |

\* cited by examiner

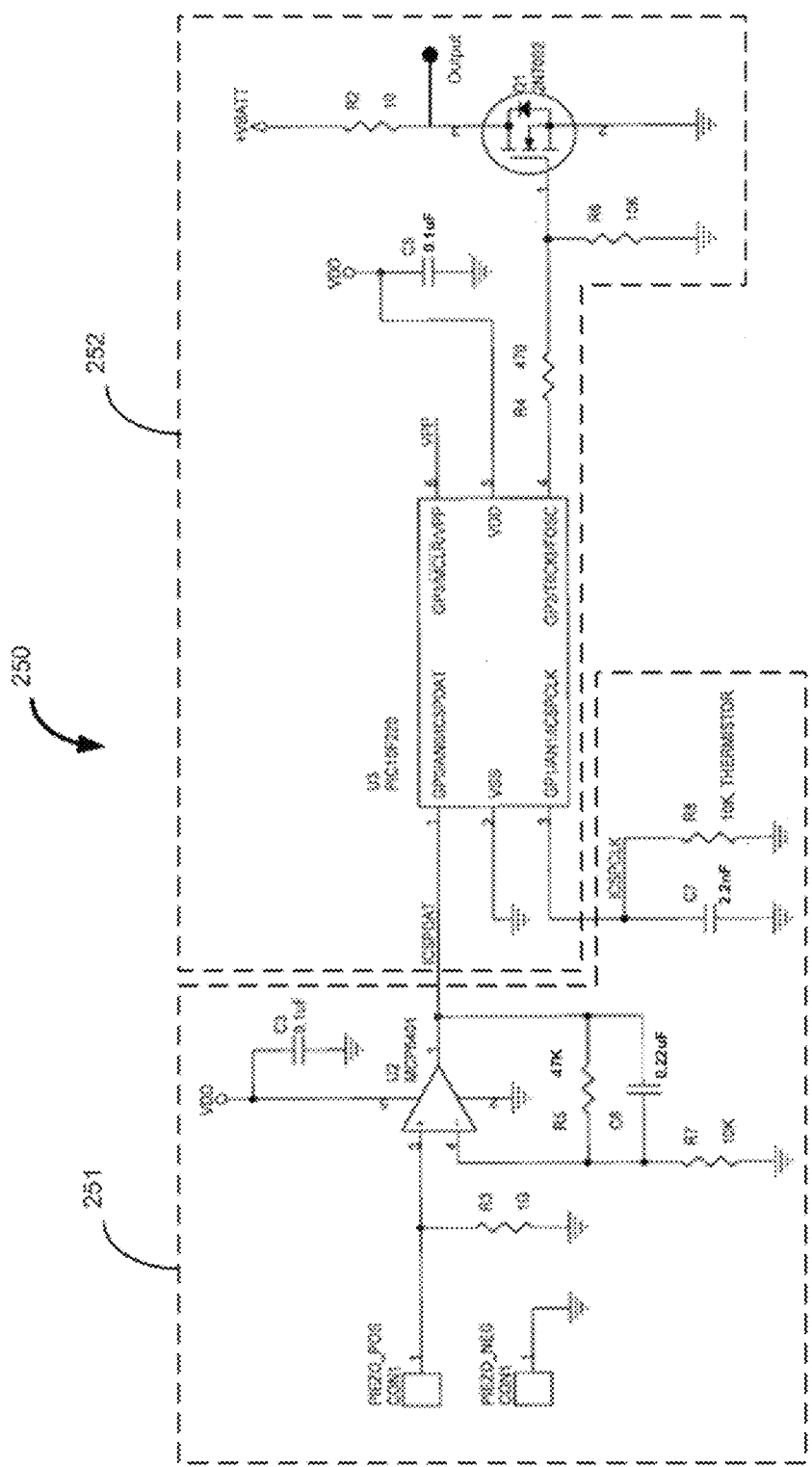
FIG. 2B1

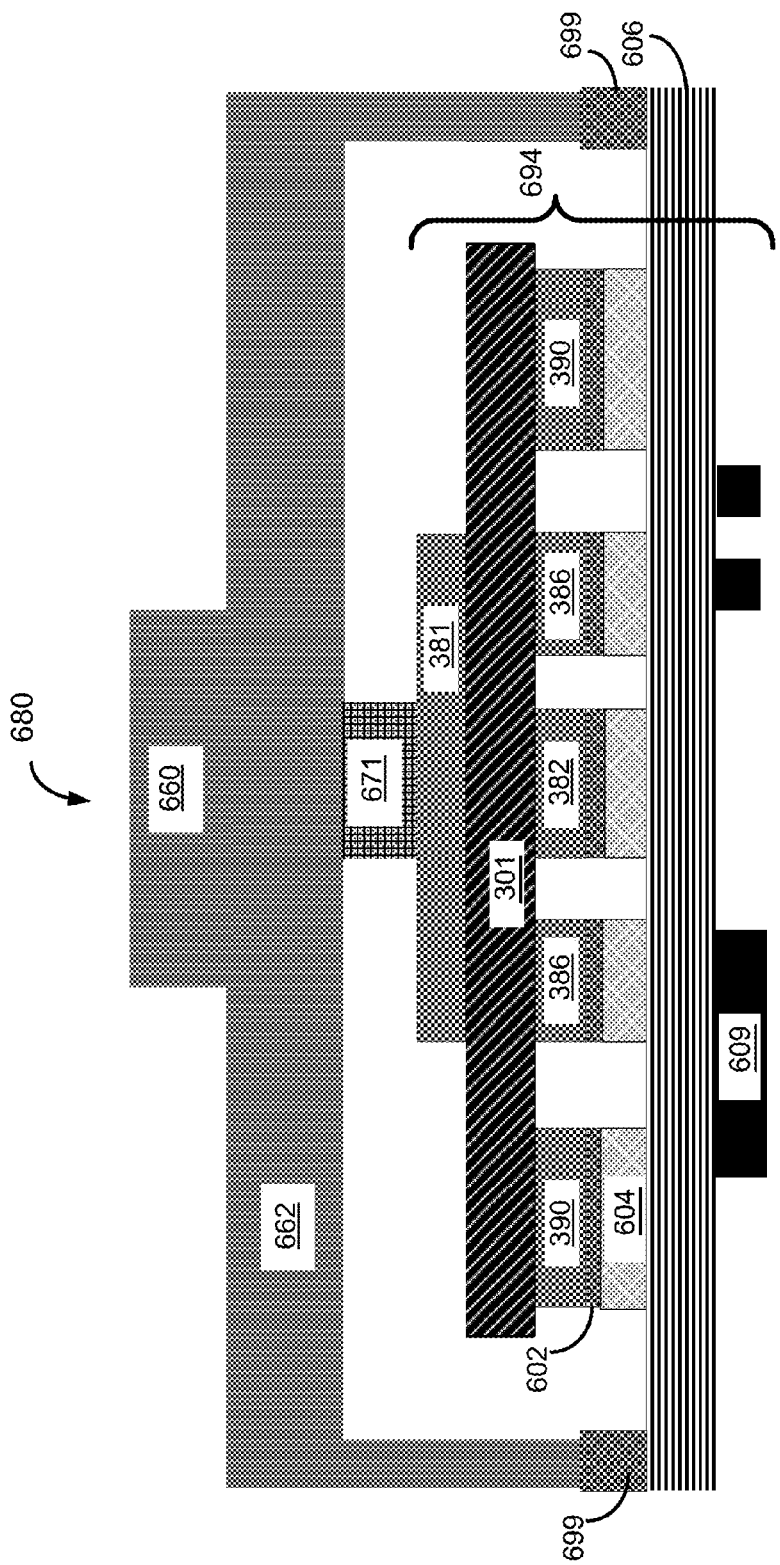
FIG. 6B1

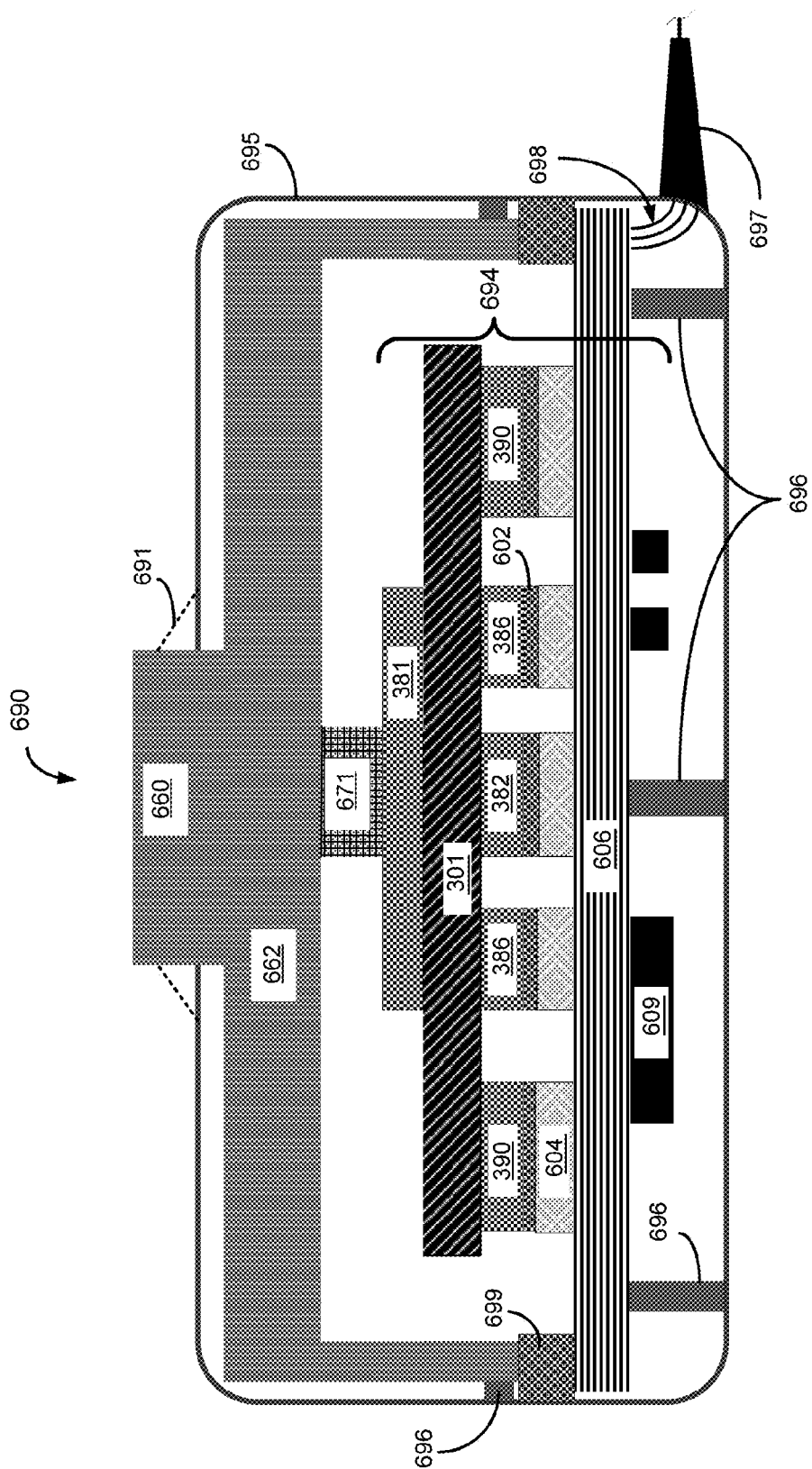
FIG. 6B2

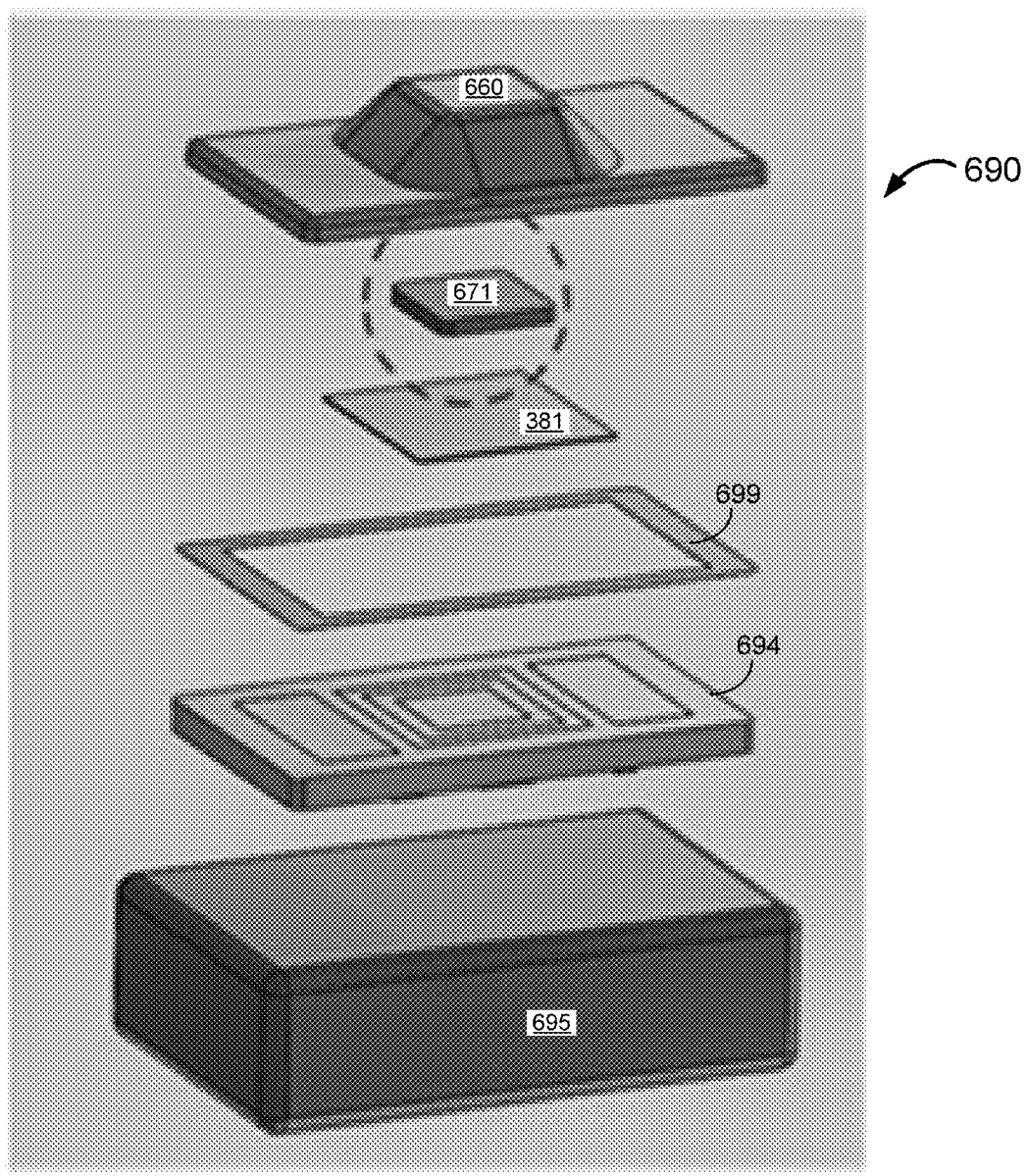
FIG. 6B3

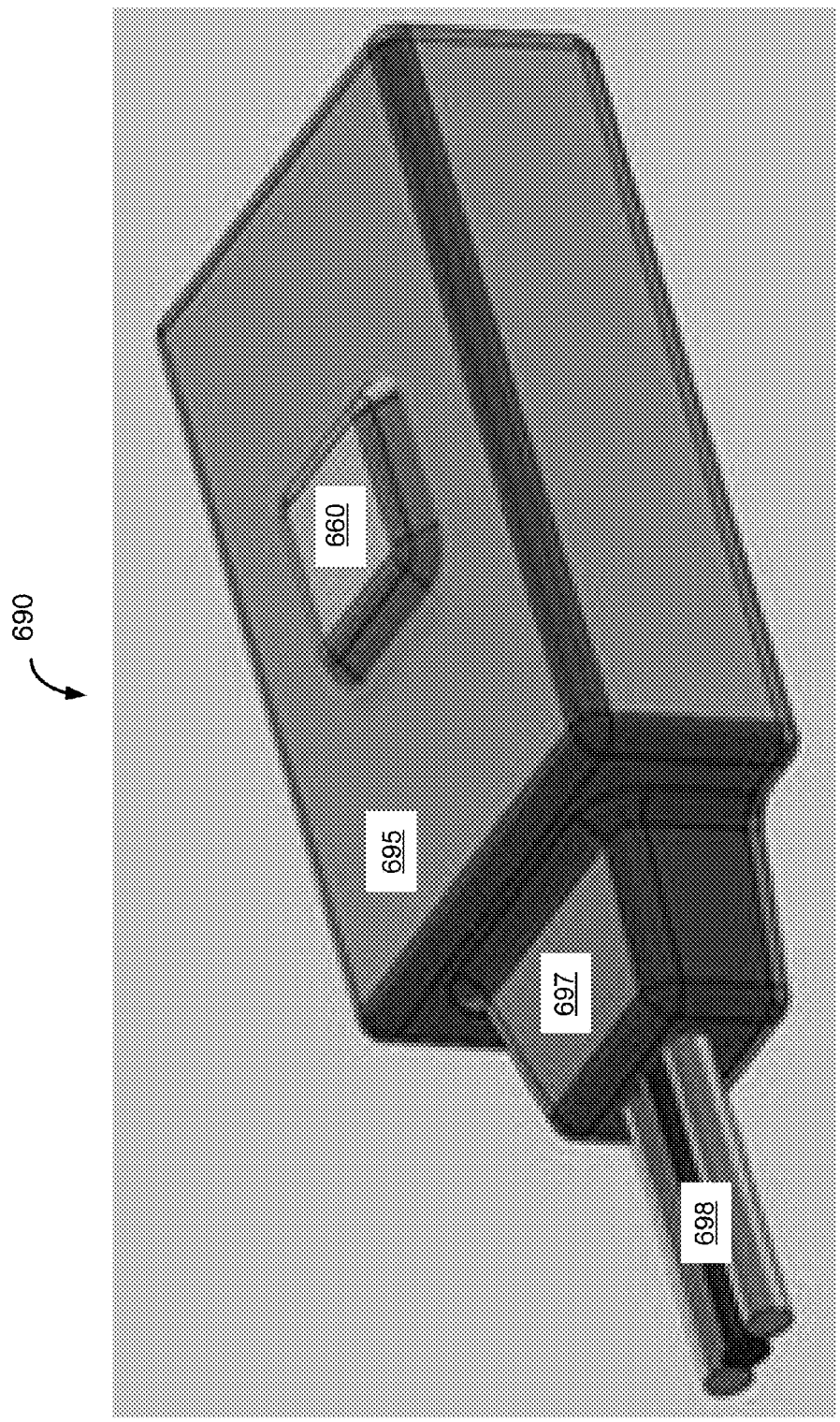
FIG. 6B4

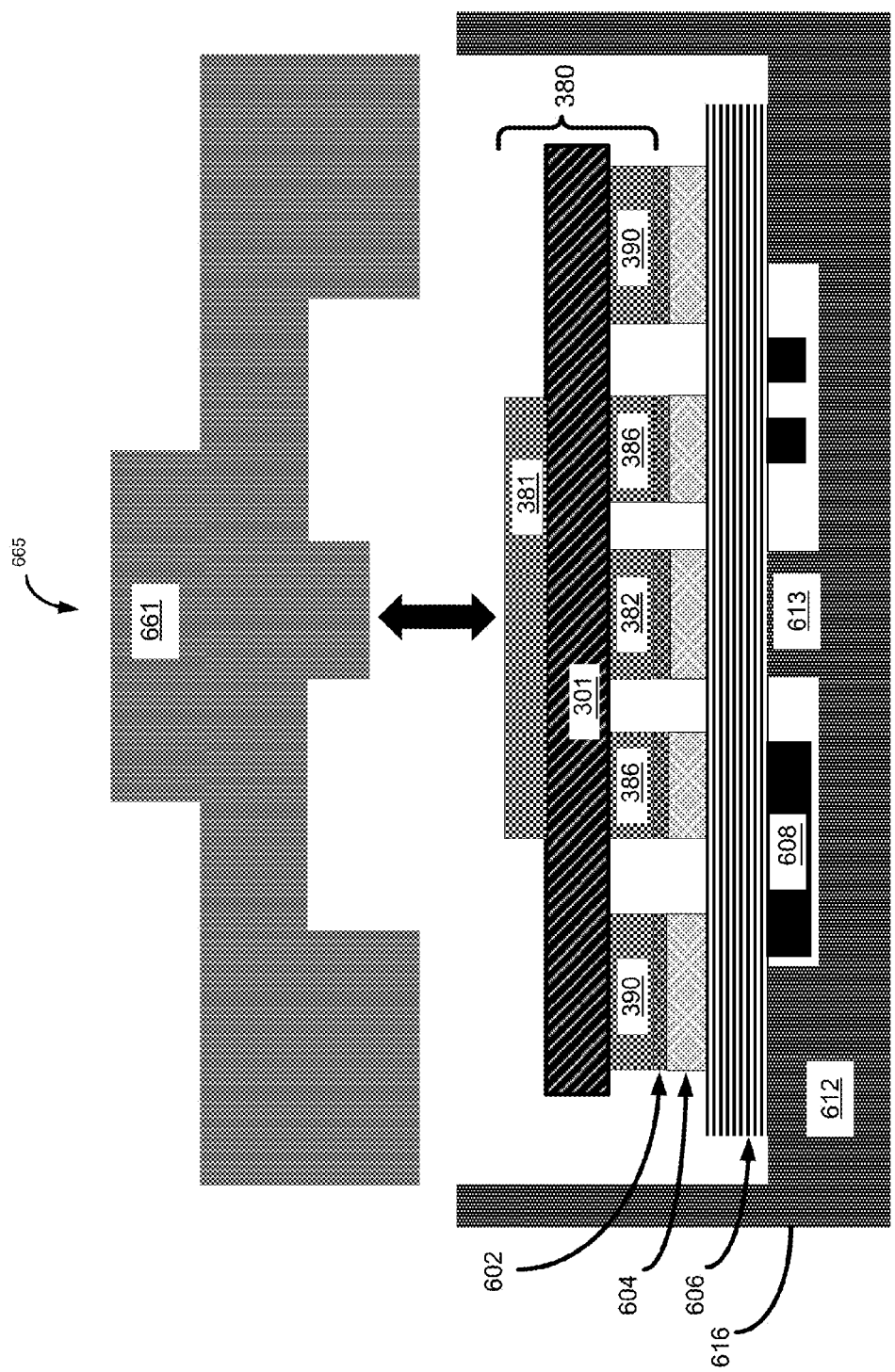

SYSTEMS AND METHODS FOR PRESS FORCE DETECTORS

CROSS REFERENCE TO RELATED APPLICATIONS

This application is a Continuation-in-Part of U.S. patent application Ser. No. 14/987,907, filed 5 Jan. 2016, entitled "Systems and Methods for Press Force Detectors." U.S. patent application Ser. No. 14/987,907 is a Continuation-in-Part of U.S. patent application Ser. No. 14/204,217, filed 11 Mar. 2014, entitled "Systems and Methods for Common Mode Signal Cancellation in Press Detectors," published as U.S. Patent Application Publication No. US20140260679 on 18 Sep. 2014, and issued as U.S. Pat. No. 9,261,418 on 16 Feb. 2016. U.S. patent application Ser. No. 14/204,217 claims the benefit of U.S. Provisional Patent Application No. 61/777,231, filed on 12 Mar. 2013, entitled: "Pyroelectric Common Mode Cancellation," the contents of which are hereby incorporated by reference in their entirety.

BACKGROUND

Human-machine interfaces often utilize press detectors that can receive touch input for interaction with digital content, machine controls, etc. Press detectors can be configured for use with many types of applications and surfaces including, for example, car dashboard controls, touch/gesture input for portable computing devices, outdoor or harsh environment control buttons, etc. Such press detectors enable tactile human-machine interaction in a natural and preferred way.

Piezoelectric impact detectors formed from polymeric materials such as polyvinylidene fluoride (PVDF) offer cost effective and high performance detection of momentary forces, such as the push of a button or a surface, the closure of a door or latch, or the passing of a person or vehicle. These thermoplastic fluoropolymer materials can be made very thin and are typically resistant to solvents, acids, and bases. PVDF is a material that works very well in the construction of surfaces or thin sensor modules for touch and press detection. However, many piezoelectric materials such as PVDF have the disadvantage that they also respond to temperature changes, often with pyroelectric coefficients that rival their piezo coefficients. Thus, touch sensors made with materials having a large pyroelectric coefficient can produce a false signal due to a temperature change, such as for example, in a vehicle when it moves from an air-conditioned environment into extreme weather, or between shadows and hot sun. A need exists for press detectors having a reduced thermal response.

BRIEF SUMMARY

Some or all of the above needs may be addressed by certain implementations of the disclosed technology.

An example embodiment of the disclosed technology includes a press sensor element configured to reduce or eliminate thermally induced signals. In one example implementation, the sensor element includes a piezoelectric layer having a first surface in communication with a first layer, the first layer including a first conductive region, where the first conductive region covers at least a central portion the first surface. The sensor element includes a second surface in communication with a second layer, the second layer including a second conductive region, a third conductive region, and a first non-conductive void region separating the second conductive region and the third conductive region. An area of the first conductive region is configured in size relative to an area of the third conductive region to substantially reduce a thermally-induced voltage change between two or more of the first, second, and third conductive regions responsive to a corresponding temperature change of at least a portion of the piezoelectric layer.

According to another example implementation, a system is provided. The system includes a force concentrating layer, a force reception plate, and a piezoelectric element in communication with at least a portion of the force concentrating layer and the force reception plate. In one example implementation, the piezoelectric element includes a piezoelectric layer having a first surface in communication with a first layer, the first layer including a first conductive region, where the first conductive region covers at least a central portion the first surface. The piezoelectric element includes a second surface in communication with a second layer, the second layer including a second conductive region, a third conductive region, and a first non-conductive void region separating the second conductive region and the third conductive region. An area of the first conductive region is configured in size relative to an area of the third conductive region to substantially reduce a thermally-induced voltage change between two or more of the first, second, and third conductive regions responsive to a corresponding temperature change of at least a portion of the piezoelectric layer.

According to another example implementation, a method is provided for sensing, with a sensor element, a force change or a pressure change. The sensor element includes a piezoelectric layer having a first surface in communication with a first layer, the first layer including a first conductive region, where the first conductive region covers at least a central portion the first surface. The sensor element includes a second surface in communication with a second layer, the second layer including a second conductive region, a third conductive region, and a first non-conductive void region separating the second conductive region and the third conductive region. An area of the first conductive region is configured in size relative to an area of the third conductive region to substantially reduce a thermally-induced voltage change between two or more of the first, second, and third conductive regions responsive to a corresponding temperature change of at least a portion of the piezoelectric layer.

Other implementations, features, and aspects of the disclosed technology are described in detail herein and are considered a part of the claimed disclosed technology. Other implementations, features, and aspects can be understood with reference to the following detailed description, accompanying drawings, and claims.

BRIEF DESCRIPTION OF THE FIGURES

Reference will now be made to the accompanying figures and flow diagrams, which are not necessarily drawn to scale, and wherein:

FIG. 2B1 illustrates an example implementation of a distributed piezoelectric sensor measurement circuit 250, with a first portion 251 of the circuit 250 packaged with the press force detector, and having a remote second portion 252 of the circuit 250, according to an example implementation of the disclosed technology.

FIG. 6B1 is a cross-sectional side view diagram illustrating another press force detector system 680 embodiment prior to packaging, according to an example implementation of the disclosed technology.

FIG. 6B2 is a cross-sectional side view diagram illustrating a packaged press force detector system 690 embodiment, according to an example implementation of the disclosed technology.

FIG. 6B3 is a 3D exploded view illustration of a press force detector system 690, according to an example implementation of the disclosed technology.

FIG. 6B4 is a 3D illustration of an assembled press force detector system 690, according to an example implementation of the disclosed technology.

FIG. 6C is a partially exploded cross-sectional side view diagram illustrating another press force detector system 665 embodiment, according to an example implementation of the disclosed technology.

DETAILED DESCRIPTION

Figure 1:
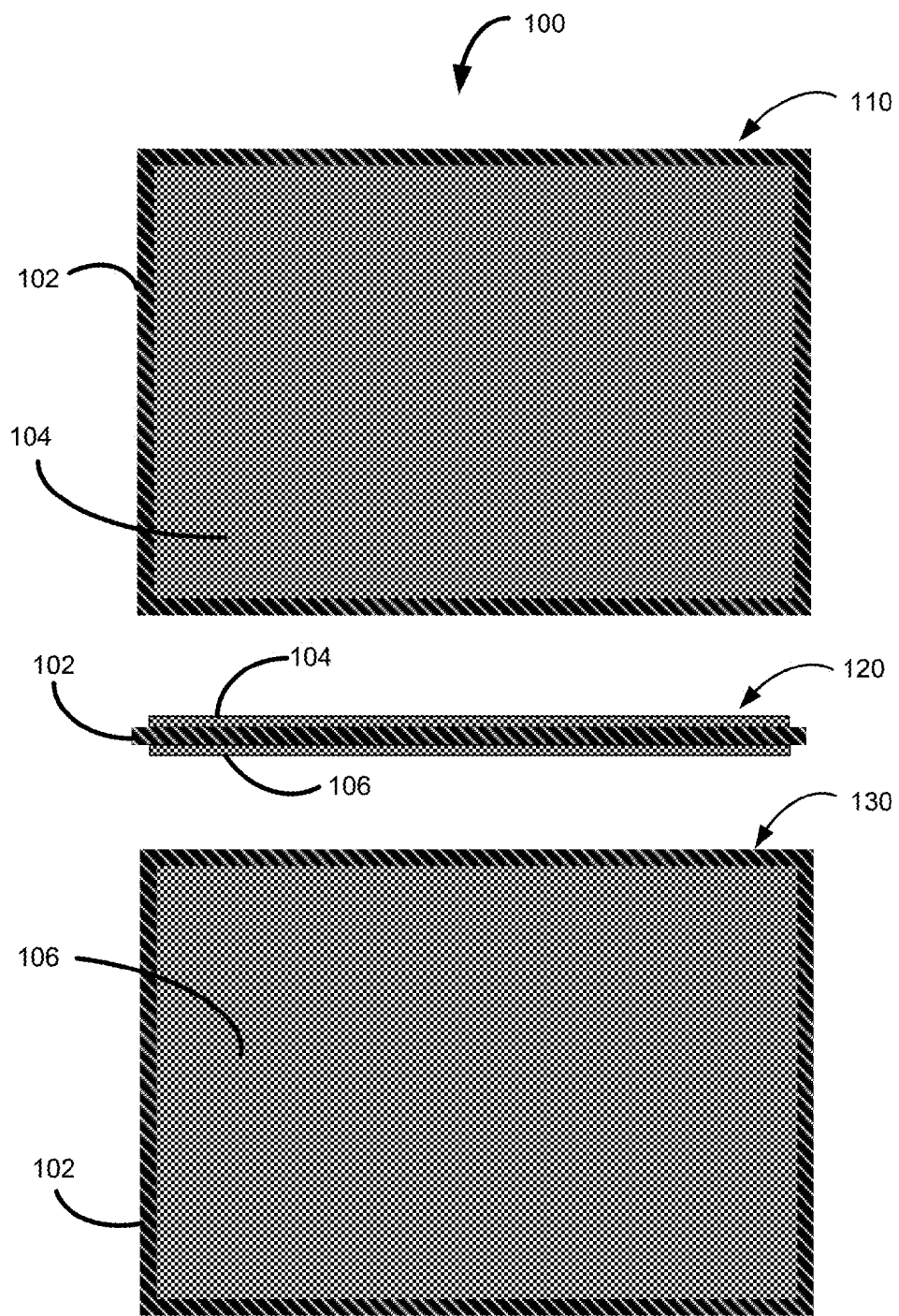
FIG. 1 depicts a top view 110, cross-sectional side view 120, and bottom view 130 of a typical piezoelectric sensor element 100.

Some implementations of the disclosed technology will be described more fully hereinafter with reference to the accompanying drawings. This disclosed technology may however, be embodied in many different forms and should not be construed as limited to the implementations set forth herein.

Example embodiments of the disclosed technology include an improved mechanical and/or electrical solution for cancellation of a pyroelectric signal that can be generated, for example, due to thermal changes experienced by certain components of the piezoelectric-based force/pressure detector. According to an example implementation of the disclosed technology, the term "pyroelectric" may refer to sensor output responsive to temperature change or thermal gradient with or without an applied force stimuli. Embodiments disclosed herein may further enable the construction of smaller and more cost-effective force/pressure detection devices having a reduced pyroelectric response that may occur due to temperature changes experienced by the device. Certain example implementations may enable compensation of temperature-dependent piezoelectric sensor output.

The terms "press detector" and "force and/or pressure sensing element" as used herein are intended to encompass sensors and/or sensor elements that can respond to, detect, and/or otherwise measure force and/or pressure exerted on a portion of the detector or element.

Certain example embodiments of the press detector may be configured to sense or detect a physical contact touch or a touch gesture, for example, from a human finger, stylus or similar object. Yet other example embodiments of the press detector may be configured to sense or detect impact, pressure variations, and/or pressure vibrations associated with a physical touch or a touch gesture.

Certain example embodiments of the press detector, as disclosed herein, may be configured to detect and/or measure sound pressure variations. For example, certain embodiments may be responsive to audible or inaudible sound or noise energy (i.e., sound pressure) of various frequency (f) and amplitude, with or without relying on an object to physically touch the press detector. Certain example implementations may be responsive to one or more audio frequency ranges, for example, subsonic frequencies ($f<\sim50$ Hz), audible ($\sim50$ Hz$<f<\sim20$ KHz), and/or ultrasonic frequencies ($f>\sim20$ Khz).

A common piezoelectric transducer material is polyvinylidenefluoride (PVDF) and its variants. The uses of PVDF film or other piezoelectric or electret materials as sensors are many and varied. PVDF polymers are available from several sources and can be extruded into films or coated onto other materials such as Silicon wafers to become part of sensors and other devices, such as MEMs.

Many common uses of PVDF material take advantage of the piezoelectric response to stretching or compression of the piezoelectric layer in order to form various impact, vibration, or touch detectors. One common use of piezoelectric material takes advantage of the pyroelectric effect to detect the heat of persons within view of the sensor. In such thermal sensors, the piezoelectric response is actually unwanted, and is typically minimized by using two piezoelectric sensor elements, both of which suffer the same mechanical disturbances but only one of which is exposed to incident thermal radiation. The two elements may be wired in anti-series, so their common piezoelectric response cancels.

In contrast with a thermal detector, and to take advantage of the piezoelectric response (i.e., to minimize the thermal response), a piezoelectric element may segmented, according to certain example embodiments, to create a compression detector that is minimally responsive to temperature changes. One possible solution, as mentioned above, is to add thermal inertia. For example, if bonded to an object with appreciable mass and specific heat, the temperature changes of a sensor element can be slowed down to a manageable rate. Another possible solution is to embed the sensor in a thermally protected space, insulated from external changes. However, both of these solutions typically increase cost, add bulk, and limit design freedom.

The piezoelectric element, as disclosed herein, is defined by areas or sections: one that will receive thermal disturbances, and another that will receive both thermal and mechanical stimuli. The two sections are then configured such that their pyroelectric signals are reduced or canceled. In accordance with an example implementation of the disclosed technology, mechanical stimuli may be primarily directed to a first section to generate a piezoelectric signal. For example, a section of a piezoelectric element may receive mechanical compression signals while other sections may avoid the compression. According to an example implementation of the disclosed technology, this may be accomplished by the use of a substantially rigid force-concentrating layer for receiving external forces and selectively transferring the force to a particular region of the piezoelectric element.

In an example implementation, a thermally conductive spreading layer may be utilized to affect the flow of heat (for example, from the force-concentrating layer) to desired sections or regions of the piezoelectric element. According to an example implementation of the disclosed technology, these effects can be compensated by adjusting the relative areas and/or placement of the layers and sections of the piezo element. For example, the thermally conductive spreading layer may be configured for relative overlap of force-sensitive and force-insensitive regions until their pyroelectric signals are approximately equal and can be canceled.

U.S. Patent Application Publication No. US20140260679, incorporated herein by reference, describes certain example implementations of a force and/or pressure sensing element that is designed to allow detection of a force/pressure signal while reducing a thermally-induced, common-mode electrical response associated with a piezoelectric layer. Example embodiments disclosed in the above-referenced Publication may utilize various arrangements of conducting regions adjacent to the piezoelectric layer to achieve the reduced thermal response, as shown in at least FIG. 3, FIG. 4, FIG. 5, and FIG. 6, and may share certain features as disclosed in the present application. Certain example implementations of the disclosed technology described and claimed herein, may include additional improvements, features, and/or configurations.

Figure 3:
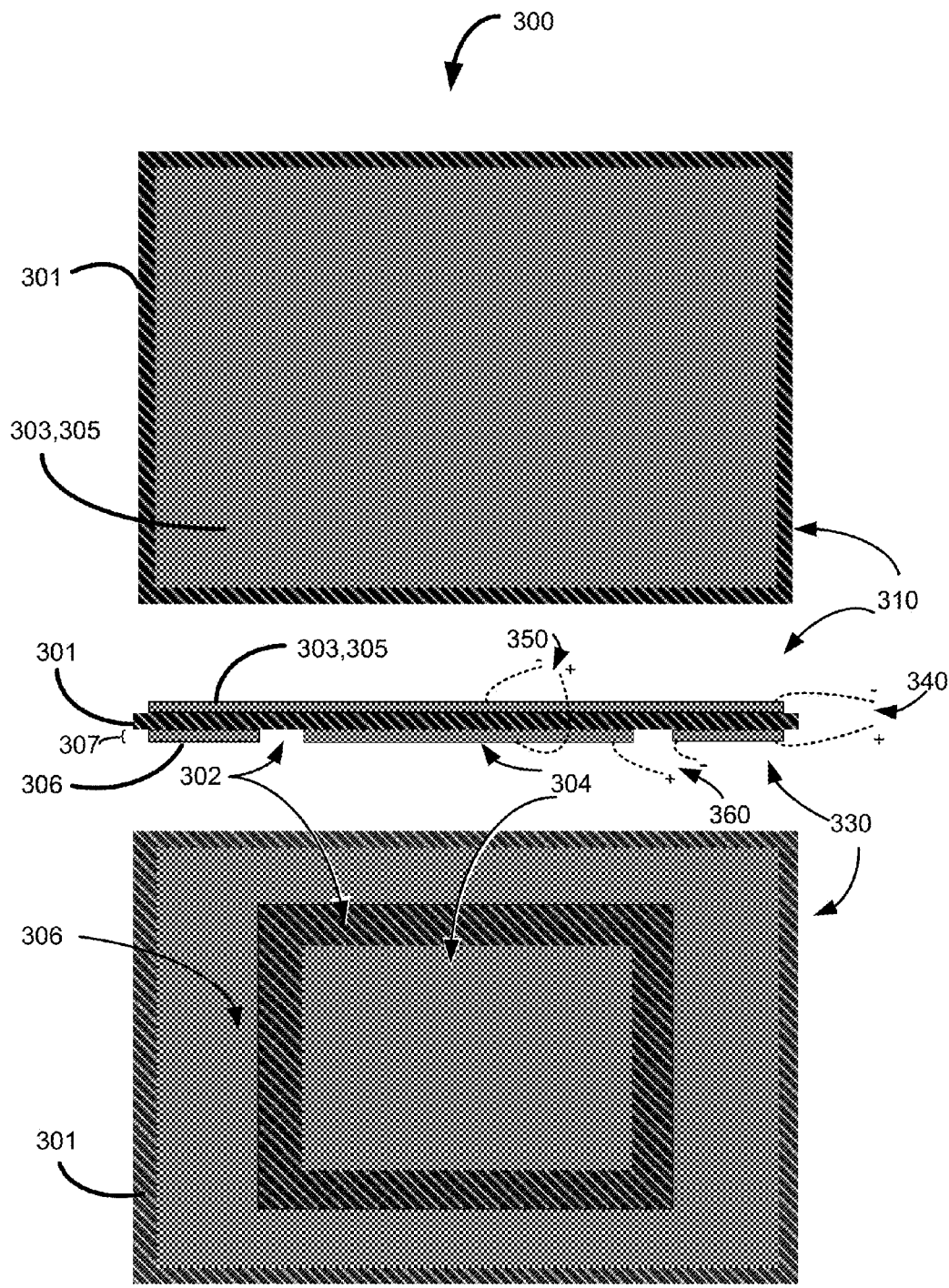
FIG. 3 depicts a top view (upper figure), cross-sectional side view (middle figure), and bottom view (lower figure) of a piezoelectric sensor element 300 according to an example implementation of the disclosed technology.
Figure 3B:
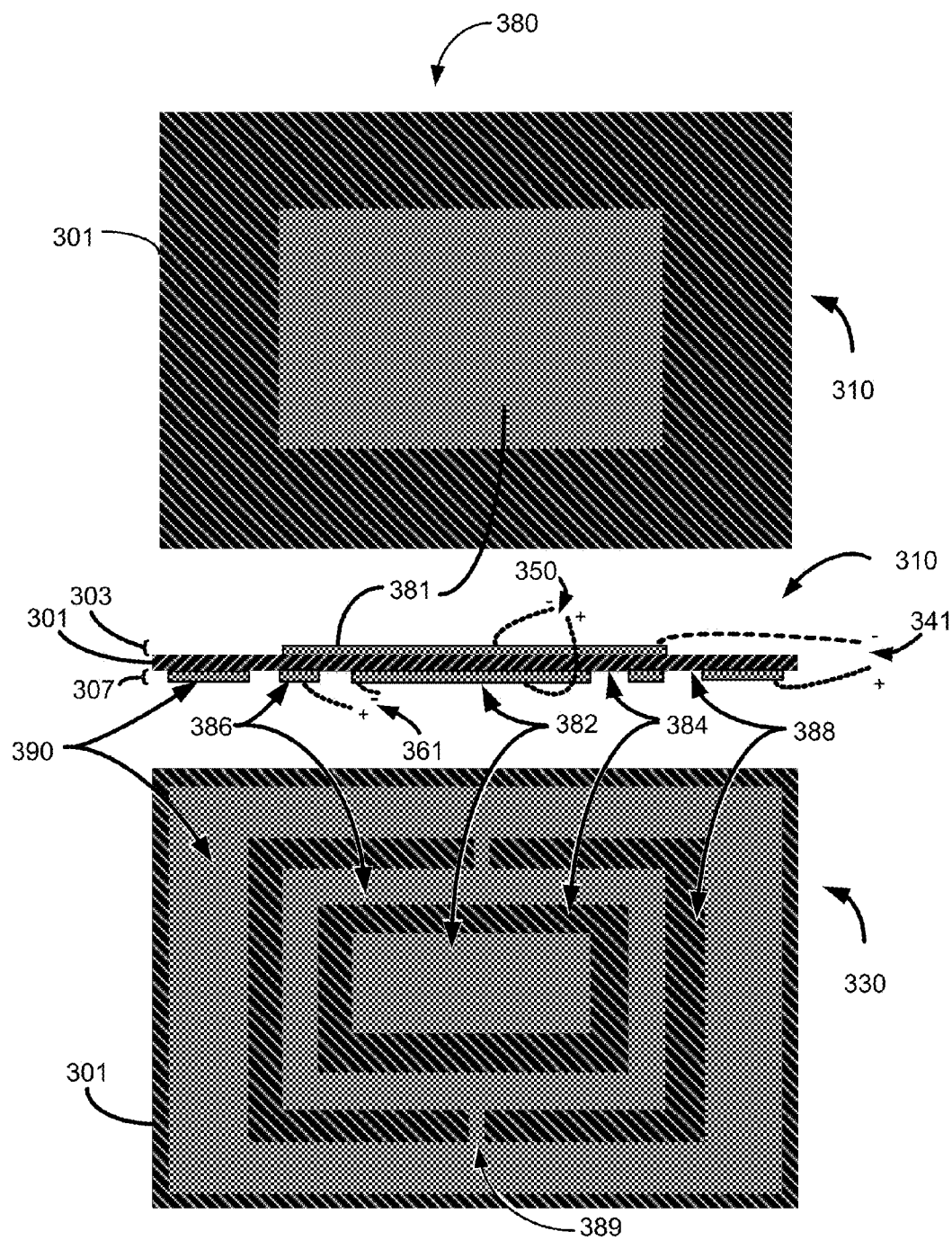
FIG. 3B depicts a top view (upper figure), cross-sectional side view (middle figure), and bottom view (lower figure) of another piezoelectric sensor element 380 embodiment, according to an example implementation of the disclosed technology.

The reader is encouraged to contrast the piezoelectric elements of FIG. 3 (and the associated housing of FIG. 5 or FIG. 6) with the piezoelectric element of FIG. 3B (and the associated housings shown in FIGS. 6B-6E) to understand how the various embodiments of the disclosed technology may reduce the thermally-induced response. For example, the piezoelectric element shown in FIG. 3, when combined with the housing arrangement of FIG. 5 or FIG. 6, may utilize one or more "force spreading" layers (502 504 for example) to distribute the input force or pressure to an outer perimeter of the piezoelectric element (306 for example), while the piezoelectric element embodiment of FIG. 3B (and the associated housings shown in FIGS. 6B-6E) may be utilized to direct the input force or pressure to an inner or central region of the piezoelectric element (382 for example). In addition, as will be explained herein, a first conductive region 381 may be utilized to spread a thermal stimulus to central and surrounding portions of the piezoelectric layer to help reduce a thermal response due to thermal gradients.

Various techniques, arrangements, configurations, etc., of press detector embodiments and associated components, as disclosed herein, and will now be further described with reference to the accompanying figures.

FIG. 1 depicts a top view 110, cross-sectional side view 120, and bottom view 130 of a typical piezoelectric sensor element 100. It should be noted that FIG. 1 shows a typical "Prior Art" device that is not necessarily configured to reduce the thermal response, but is shown for reference and for comparison purposes.

The typical piezoelectric sensor element 100 includes a piezoelectric layer 102 that may be a polyvinylidene fluoride (PVDF) film. The piezoelectric layer 102 may include electrodes 104 106 on both sides that are formed, for example, by deposition of a conductive layer. The deposition could be a vacuum deposited metal, a screen printed conductive polymer thick film, carbon nanotube (CNT) printable ink, or other method known in the art. The sensitive area of the film is typically defined by the area of overlap of metallization of the two sides.

Figure 2:
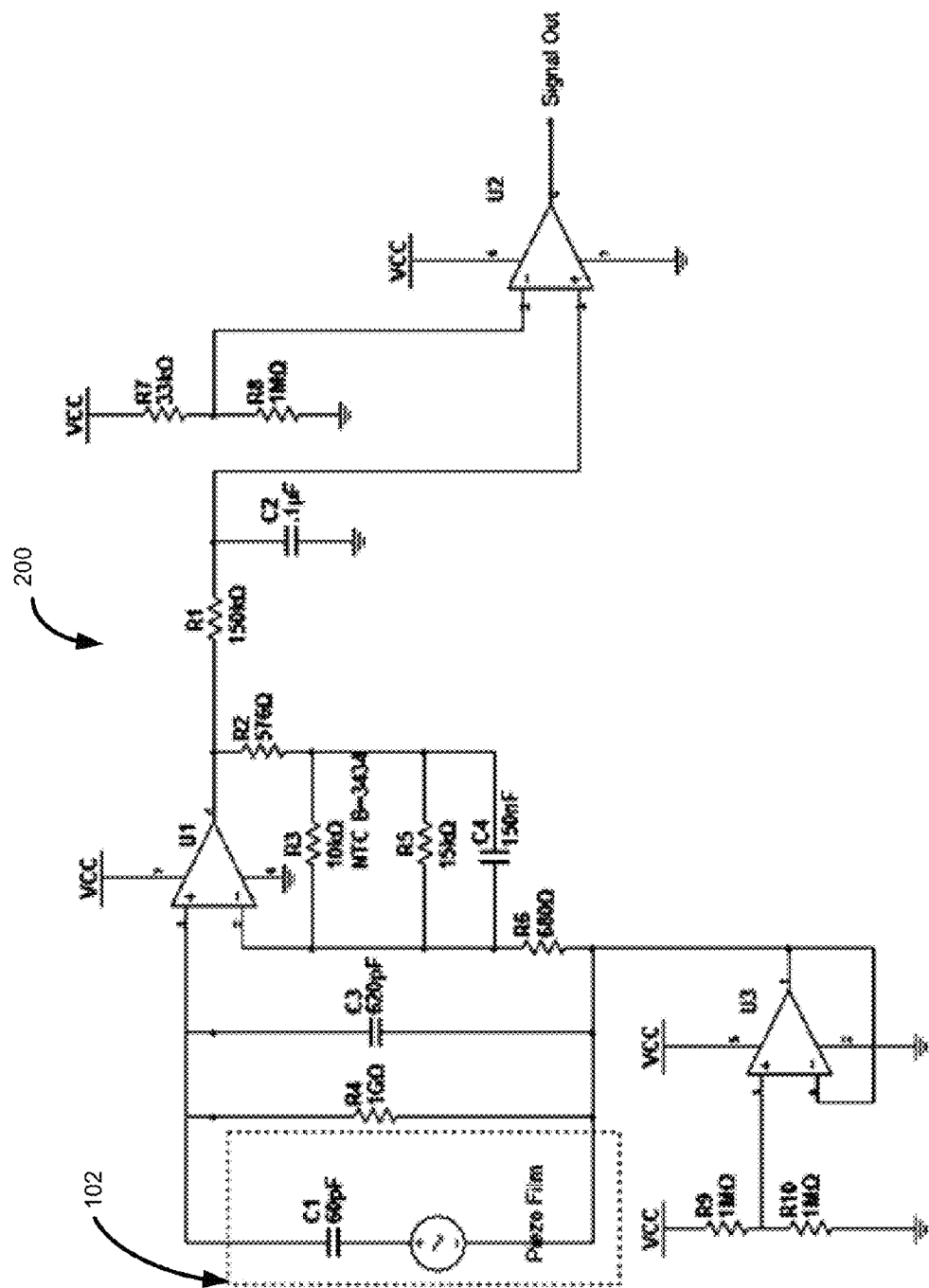
FIG. 2 illustrates an example piezoelectric sensor measurement circuit 200, as is known in the art.

FIG. 2 illustrates an example piezoelectric sensor measurement circuit 200, as is known in the art. The piezoelectric element (for example, the piezoelectric sensor element 100 of FIG. 1) may be represented on the far left portion of the circuit 200 as an AC signal in series with a small capacitance. In a typical arrangement, the piezoelectric element may be placed in parallel with high value resistor R4 in order to convert charge to voltage while achieving response at low frequencies. The additional parallel capacitance C3 may be utilized to enhance the low frequency response. C3 may have the side effect of reducing signal strength, which may be compensated in certain embodiments by increasing the gain of the first stage amplifier.

The signal generated by interaction with the piezoelectric element may be amplified by a first stage op amp U1. The gain of this traditional non-inverting configuration is set by resistors R2, R3, R5, and R6. Resistor R3 is a negative temperature coefficient thermistor, used here to increase gain at lower temperatures. This effectively compensates for the reduced sensitivity of the piezoelectric element at low temperatures. Capacitor C4, and also the low pass RC filter provided by R1 and C2, provide signal smoothing and rejection of 60 Hz noise.

The reference voltage for amplifier stage U1 is set by op amp U3, which is configured as follower in order to supply Vcc/2. A positive signal in response to compression of the piezo film will cause the output of this first stage amplifier to rise above Vcc/2. Relaxation of the compression causes the output to fall below Vcc/2.

An analog output of this first stage amplifier could be used by a measurement circuit directly. Alternately, a second stage could be provided to create a digital signal. Here op amp U2 is configured as a comparator that will provide a high signal whenever the first stage amplifier output rises near Vcc. This digital signal could then be connected to an interrupt input to a host circuit, or used to drive a transistor for switching another signal.

Figure 2B:
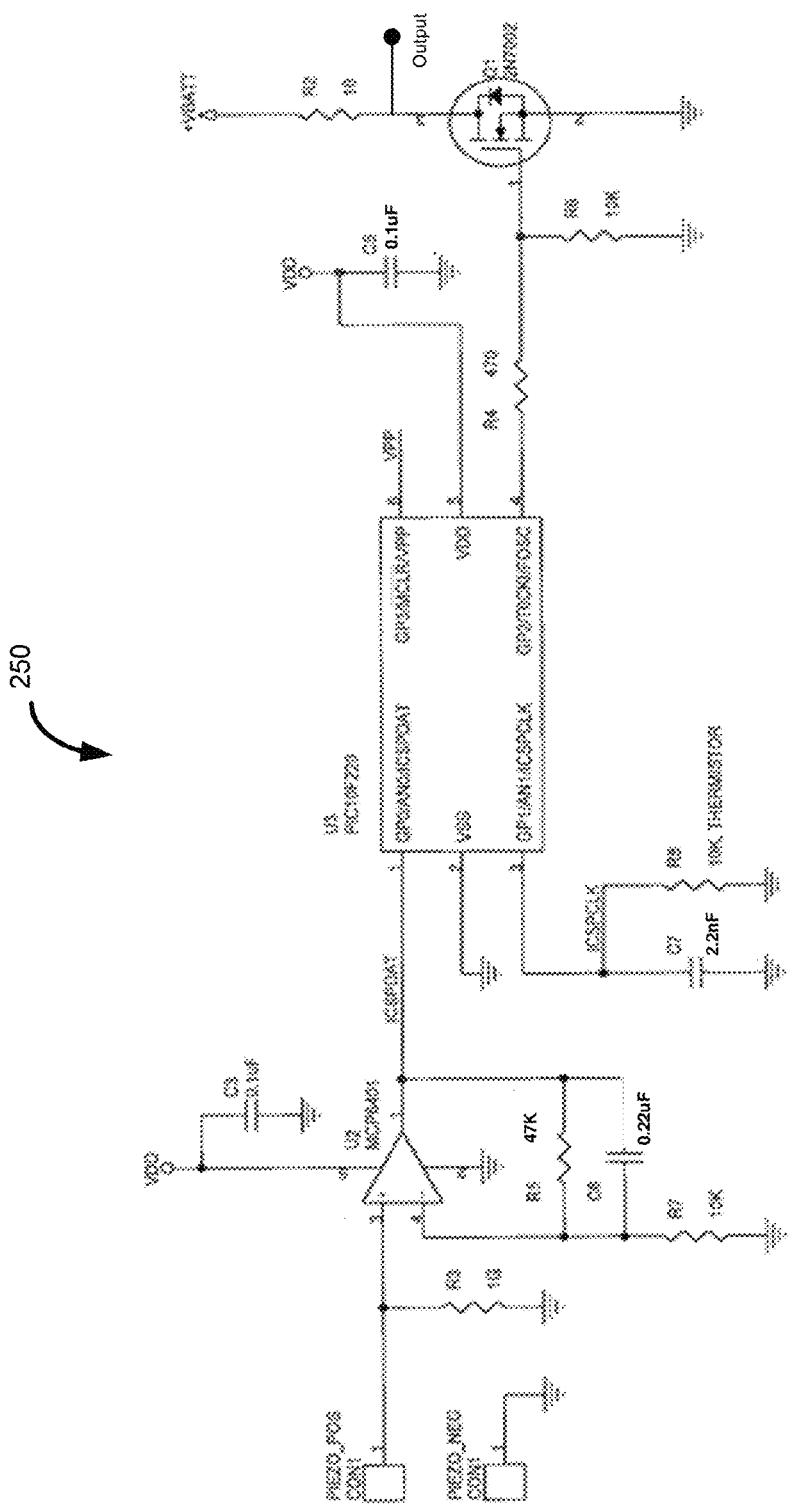
FIG. 2B illustrates an example piezoelectric sensor measurement circuit 250, according to an example implementation of the disclosed technology.

FIG. 2B illustrates an example piezoelectric sensor measurement circuit 250, according to an example implementation of the disclosed technology in which functional blocks may be included to achieve mixed-signal processing. According to an example implementation of the disclosed technology, a piezoelectric sensor element may be electrically connected between the PIEZO_POS and PIEZO_NEG terminals. The signal generated by the piezoelectric element (for example, in response to an applied force) may be amplified by an op amp U2. The gain and frequency response may be set by resistor R5 and C6 in the feedback loop of the op amp U2.

In accordance with an example implementation of the disclosed technology, a microcontroller U3 may be used to sample the analog signal (for example, the analog signal received from the op amp U2) for performing analog to digital conversion and subsequent processing. In accordance with an example implementation of the disclosed technology, the microcontroller U3 may be configured to perform digital signal processing on the digital signal using embedded firmware. For example, the embedded firmware may be utilized to recognize various signal parameters and/or switching conditions (such as a true press, false press, thermally-induced signal, etc.), so that the operation and function of the press detector may be enhanced for more reliable operation and output.

In accordance with an example implementation of the disclosed technology, a thermistor R8 may be utilized to measure ambient temperature at or near the piezoelectric element, for example, so that the microcontroller U3 may utilize the thermistor R8 signal to compensate the temperature-dependent signal received from the piezoelectric element. The piezoelectric sensor element output is typically proportional to temperature, i.e. having a positive temperature coefficient. Thus, such temperature compensation may be used by the microcontroller U3 and embedded firmware to further distinguish between the various signal parameters and/or switching conditions as a function of temperature. For example, in the event that there is a thermal cycling (which tends to induce a relatively slowly changing response), the firmware can be used to distinguish between thermal cycling, different types of pushes, momentary pushes, etc. In certain example implementations, accidental pushes may be further distinguished from intentional pushes, for example, by setting a minimum response threshold and/or associated duration of the signal received from the piezoelectric element. In certain example implementations, the rise time of the signal may be utilized to distinguish between accidental and intentional pushes.

Certain example implementations may measure a temperature of the press detector. Certain example implementations may include a lookup table, for example, to calibrate and/or compensate a response of the press detector based on the measured temperature. For example, certain implementations of the disclosed technology may be configured for use at very low temperatures. In some embodiments, the thermistor R8 may be used to measure the temperature, and the lookup table may be accessed, for example, from a memory associated with the microcontroller U3 to provide temperature compensation and/or calibration corresponding to the measured temperature or temperature range.

In accordance with an example implementation of the disclosed technology, the microcontroller U3 and associated circuitry may be integrated within a press detector. In certain example implementations, the piezoelectric sensor measurement circuit 250 can include one or more low-noise amplifiers, for example to further buffer any of the associated signals, including but not limited to the raw output from the piezoelectric element, the output of the compactor U2, the output of the microcontroller U3, and/or the output of the piezoelectric sensor measurement circuit 250.

In certain example implementations, the piezoelectric sensor measurement circuit 250 may include a wireless interface, for example, to transmit a wireless signal or indication to a receiver associated with external circuitry.

In accordance with an example implementation of the disclosed technology, the microcontroller U3 may generate and provide a switching signal (for example, from pin 4 as shown). In certain example implementations, the switching signal may be in communication with one or more output components that may be configured to buffer the output of the microcontroller U3 while providing a switching output indication to external circuitry. FIG. 2B shows an example field-effect transistor Q1 that may receive the signal from the microcontroller U3 and act as a digital logic output switch to provide the overall output to external circuitry, for example, via a pull-up resistor R2 and a voltage supply +VBATT.

FIG. 2B1 illustrates an example implementation of a distributed piezoelectric sensor measurement circuit 250, with a first portion 251 of the circuit 250 packaged with the press force detector. In this example implementation, a second portion 252 of the circuit 250 may be in communication with the first portion 251, but located remotely from the force press detector packaging. As indicated, the first portion 251 of the circuit 250 that is packaged with the press force detector may include the thermistor in communication with the remotely-located microprocessor U3, for example, to provide a signal for temperature compensation.

In some applications, there may be certain advantages associated with the remotely-located microcontroller U3 and/or the transistor Q1, for example, to reduce cost, component count and physical space required for the sensor implementation. This approach may also allow the microcontroller firmware/software to be calibrated, upgraded, and/or modified without requiring direct access to the force press detector package. Furthermore, and according to an example implementation of the disclosed technology, a remotely-located microcontroller may be used to interface with an array of press force detectors, for example, by using a multiplexer (not shown). In certain example implementations, the external/remote mounting of the microcontroller U3 may improve thermal/mechanical protection, reliability, and/or operation, particularly in applications in which the press force detector is exposed to harsh environment conditions.

In certain example implementations, the transistor Q1 and associated circuitry may be utilized to drive an electronic actuator or a motor. In some implementations, drive electronics (such as the transistor Q1 and associated circuitry) may be optional. In some example, implementations, the drive electronics may be located remotely from the second portion 252 of the circuit, for example, to enable a modular approach in which specific drive or output circuits may be selected, depending on the given application.

FIG. 3 depicts a top view (upper figure), cross-sectional side view (middle figure), and bottom view (lower figure) of a piezoelectric sensor element 300 according to an example implementation of the disclosed technology. In an example implementation, the piezoelectric sensor element 300 includes a piezoelectric layer 301 having a first surface 310 and a second surface 330. In an example implementation, the first surface 310 of the piezoelectric layer 301 may be in communication with a first layer 303 that may include a first conductive region 305. In one example implementation, the first layer 303 may be defined by a conductive region 305 covering most of the first surface 310 of the piezoelectric layer 301. In other example implementations, the first conductive region 305 may cover a portion of the first surface 310 of the piezoelectric layer 30. In certain example implementations, the conductive region 305 may include a conductive organic material, a conductive polymer, a metal, a transparent conductive metal-oxide, graphene, carbon nanotubes (CNT), metal nanorods, metal particles, metal oxide particles, or a mixture thereof.

According to an example implementation of the disclosed technology, the second surface 330 of the of the piezoelectric layer 301 may be in communication with a second layer 307. In an example implementation, the second layer may include a second conductive region 304, a third conductive region 306, and a non-conductive void region 302 separating the second conductive region 304 and a third conductive region 306. In certain example implementations, the conductive regions 304 306 may include a conductive organic material, a conductive polymer, a metal, a transparent conductive metal-oxide, graphene, carbon nanotubes (CNT), metal nanorods, metal particles, metal oxide particles, or a mixture thereof. According to certain example implementations of the disclosed technology, the various conductive layers may be defined via printing of conductive polymer thick film inks, printable inks including carbon nanotubes (CNT), evaporation of a metallic film through a mask, or other methods known in the art.

In accordance with an example implementation of the disclosed technology, the second layer 307 may be segmented into two or more conductive regions 306 304 separated by one or more non-conductive void region 302. In an example implementation, one of the conductive regions 306 304 may be arranged or configured to respond primarily to thermal stimuli, while the other of conductive regions 306 304 may be arranged or configured be responsive to both mechanical force and thermal stimuli.

FIG. 3 also depicts example response signal measurement leads corresponding to pairs of conducting regions 304 305 306. For example, measurement leads may be connected to the first conductive region 305, the second conductive region 304, and the third conductive region 306 to monitor the charge and/or voltage responses 340, 350, 360, between respective pairs of conductive regions 310-330, 310-304, 330-304.

Not shown in FIG. 3, but are considered within the scope of the disclosed technology, are other possible connection methods besides the general illustration of the example signal measurement leads that are shown in FIG. 3. For example, other measurement and/or signal leads may be configured as one or more tails (or pigtails) extending from one or more edges of the piezoelectric sensor element 300, where traces from the desired conductive regions (for example, from the second 304 and third 306 conductive regions) may be routed along the tail. In one example implementation, the tip of the tail could be inserted into a connector. In another example implementation, a connector could be attached to the tail for mating with another connector. In another example implementation, measurement and/or signal leads may be crimped-on, riveted to, or soldered to terminals in contact with the various conductive regions. In certain example implementations, the conductive traces associated with measurement and/or signal leads may extend down the tail on opposite faces of the tail, each emanating from the conductive regions on one face of the element. Alternately, either on the main body of the piezoelectric sensor element 300 or on the tail, the signals from one side of the piezoelectric sensor element 300 may be brought to the other side of the element using a conductive via, similar to conductive vias well known in printed circuit board construction. In an example implementation, the tail may be inserted into a connector that has contact elements only for traces facing a single direction.

Many other forms of connection for accessing response signals from the piezoelectric sensor element 300 may be utilized according to example implementations of the disclosed technology. For example, conductors made from conductive epoxy, solid or patterned conductive pressure sensitive adhesive films, and/or physical contact with signal traces may be utilized since the signal from the piezoelectric sensor element 300 is fundamentally a dynamic signal. According to an example implementation of the disclosed technology, an AC signal may be coupled from the piezoelectric sensor element 300 through a thin dielectric layer.

To accommodate complex geometries, mounting holes, or other constraints, the piezoelectric sensor element 300 and associated layers and regions may be further segmented into any number of sections, and will be discussed below with reference to FIG. 6. However each section may be categorized as responsive primarily to thermal stimuli or responsive to both mechanical and thermal stimuli.

FIG. 3B depicts a top view (upper figure), cross-sectional side view (middle figure), and bottom view (lower figure) of another piezoelectric sensor element 380 embodiment, according to an example implementation of the disclosed technology. This piezoelectric sensor element 380 embodiment shares many of the features as discussed above with respect to FIG. 3, with the exception of the placement, shape and/or size of some of the conductive regions 381 382 386 390 and non-conductive void regions 384 388. For example, in this second example embodiment, a first conductive region 381 may cover at least a central portion the first surface 310 associated with the piezoelectric layer 301. In certain example implementations, this first conductive region 381 may be aligned to cover and/or overlap regions on the on the second surface 330, such as a second conductive region 382, a third conductive region 386, and a first non-conductive void region 384 separating the second conductive region 382 and the third conductive region 386. In certain example implementations, a fourth conductive region 390 may surround the third conductive region 386. In certain example implementations, a second non-conductive void region 388 may at least partially separate the fourth conductive region 390 and the third conductive region 386. In certain example implementations, the fourth conductive region 390 may be in electrical communication with the third conductive region 386, for example, by one or more conductive bridge regions 389 that cross through the second non-conductive void region 388.

In accordance with an example implementation of the disclosed technology, signals generated by the sensor element 380 may be output via a direct physical signal tap 361 with electrodes that are connected to the second conductive region 382 and one or more of the third conductive region 386 and/or the fourth conductive region 390 (which may be are electrically connected to the third conductive region 386 via a conductive bridge region 389).

In accordance with certain example implementations of the disclosed technology, one or more of a first internal signal tap 341 and a second internal signal tap 350 may provided, as shown in FIG. 3B, to provide additional monitoring, biasing, etc.

As may be apparent with the aid of FIGS. 6B-6E and associated descriptions, at least one key difference between a press sensor that utilizes the piezoelectric sensor element 300 of FIG. 3 (first embodiment) vs. a press sensor designed for use with the piezoelectric sensor element 380 of FIG. 3B (second embodiment) is that the second embodiment is designed for a press force to be primarily incident within the central region of the sensor element 380, such as aligned within the second conductive region 382. In contrast, the first embodiment is designed for the press force to be primarily distributed around the outer perimeter of the piezoelectric sensor element 300 (such as aligned with the third conductive region 306 of FIG. 3). One of the advantages of the second embodiment is that it may help avoid certain delamination issues (such as caused by thermal expansion), and open circuits, for example between the various electrodes and associated substrates.

Another difference between the first embodiment and the second embodiment is that the first conductive region 381 of the second embodiment may be configured to conduct and spread any thermal stimulus that is applied to the first conductive region 381 to portions of the piezoelectric layer 301 corresponding to an overlap of the first conductive region 381 with the second 382 and the third 386 conductive regions to reduce the thermally-induced voltage change that may be experienced in these areas.

Figure 4:
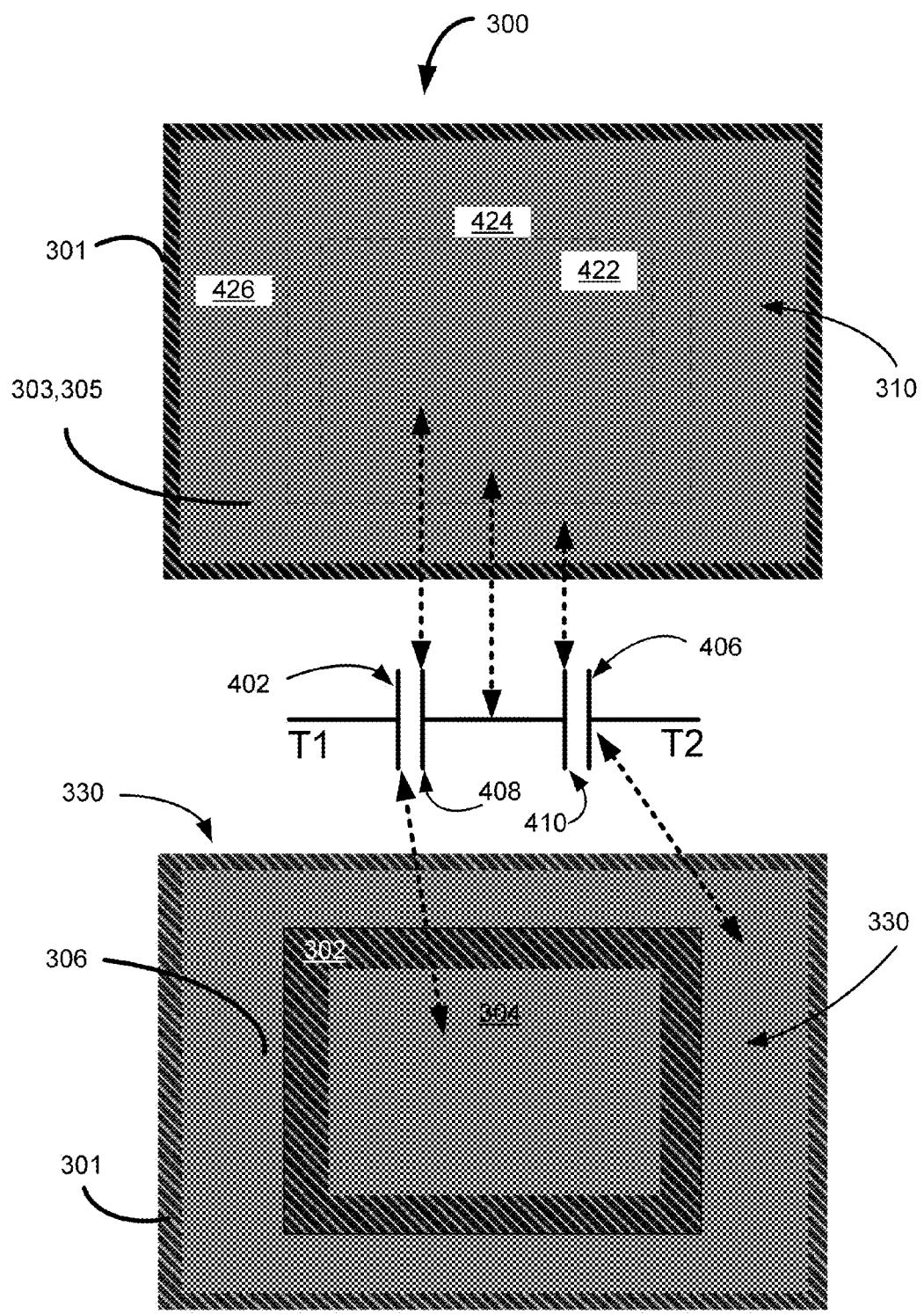
FIG. 4 illustrates capacitive elements that are schematically equivalent to layers and regions of a piezoelectric sensor element 300, as depicted in FIG. 3, according to an example implementation of the disclosed technology.

FIG. 4 illustrates capacitive elements that are schematically equivalent to layers and regions of a piezoelectric sensor element 300, according to an example implementation of the disclosed technology. FIG. 4 and the associated description provides information that may enable an understanding of how to make and use certain embodiments of disclosed technology for reducing a thermally-induced, common-mode electrical response associated with a piezoelectric layer, particularly with reference to the first embodiment as show in FIG. 3. However, certain aspects shown and discussed with respect to FIG. 5 may also be utilized with the second embodiment as shown in FIG. 3B.

As known to those having skill in the art, piezoelectric film elements have an associated polarity such that when the film is compressed, a charge separation is generated that results in a voltage potential difference between one side of the film and the other side. Certain aspects of the disclosed technology may be utilized regardless of which polarity is chosen for the faces. However for clarity of description, it will presumed that the polarity of the piezoelectric element 301 is chosen to provide a positive charge on the (segmented) second surface 330 during compression relative to the charge presented at the first surface 310 of the piezoelectric layer 301. With this choice, mechanical stimuli (for example, compression) may cause the outer region (for example, the third conductive region 306) of the second surface 330 to become more positive with respect to the first conductive region 305 that is associated with the first layer 303.

In accordance with an example implementation of the disclosed technology, two or more regions 304 305 306 of the piezoelectric sensor element 300 may be connected in a series combination that may serve to cancel signals that originate commonly in both regions.

As depicted in FIG. 4, the piezoelectric element 300 may be represented by a first capacitor having a first capacitive plate 402 defined by the second conductive region 304 on the segmented side (second surface 330) of the piezoelectric layer 301, and a corresponding second capacitive plate 408 defined approximately by a first conductive area 422 of the first layer 310 that is opposite the second conductive region 304 of the second layer 307 (or second surface 330).

Also depicted in FIG. 4, and according to an example implementation, is a second capacitor represented by a third capacitive plate 410 that is defined approximately by a second conductive area 426 of the first surface 310 that is opposite the third conductive region 306 of the second layer 307 (or second surface 330). Finally, a fourth capacitive plate 406 of the second capacitor may be defined by the third conductive region 306 of the second layer 307 (or second surface). The common conductor, as depicted connecting the first and second capacitors in series, may represent and be defined by a third conductive area 424 of the first surface 310 that is opposite the non-conductive void region 302 of the second layer 307 (or second surface 330).

According to an example implementation of the disclosed technology, the innermost plates 408 410 of the two capacitors may be considered to be a common plate, approximately defined by the first surface 310 and having a single zone of conductivity (for example, metallization) and arbitrarily chosen to be the negative face of the piezoelectric element assembly 300. In one example implementation, these innermost capacitor plates are not connected to a terminal per se of the series combination; there is no connection to these plates, just as there is no separately defined discreet "connections" joining the corresponding faces (for example, connecting the first conductive area 422, second conductive area 426, and the third conductive area 424) as the first layer 303 may be a continuous conductive layer.

According to one example implementation, the terminal T1 of the series combination, and as shown in FIG. 4, may correspond to a primarily thermal responsive region of the second surface 330, while terminal T2 may correspond primarily to the mechanical responsive region second surface 330 (depending on a configuration of a mask as will be discussed with reference to FIG. 5 and FIG. 6 below). For example, by applying a mechanical stimulus, recalling that a mask layer may be utilized to concentrate any pressure stimulus only to the outer ring region (i.e., the third conductive region 306) may cause the outer ring of the second surface 330 to become positive. In the capacitor model, as described above, this area corresponds to T2. In an example implementation, the positive charge on T2 may cause a corresponding negative charge to appear on T1. According to an example implementation, an amplifier connected to these terminals T1 T2 may be utilized to detect a signal proportional to the magnitude of the stimulus.

However, subjecting the entire piezoelectric layer 301 to a temperature change may cause both sections associated with the piezoelectric layer 301 (i.e., the second conductive region 304 and the third conductive region 306) to generate a like charge on the corresponding conductive areas 422 426 of the first surface 310. Thus, in the capacitor model, both T1 and T2 may see this like charge. According to an example implementation (and depending on factors such as the area proportion of the second and third conductive regions 304 306) an amplifier connected to the T1 and T2 terminals may register little or no thermally-induced voltage difference, and such thermally-generated signals would tend to cancel as a result of this novel arrangement.

With regard to making electrical connections to the various conductive regions (for example to conductive regions 304 306) for routing signals to be sensed (for example, by circuit 200 or circuit 250), certain electrodes and/or conductive contacts may be made to the two conductive regions 304 306 on the (segmented) second surface 330 of the piezoelectric element assembly 300. In one example implementation, the connection could be made by routing the traces from these sections down a connecting tail (not shown). Alternately, the connection could be made by pressing the two conductive sections against conductive pads on a printed circuit board. Because the sensor is intended to sense compression, the actuation of the sensor may serve to enhance the contact between the conductive region of the piezo element and the pads on the circuit board. For a more robust connection, a conductive pressure sensitive adhesive film, such as AR8001 from Adhesives Research, Inc., could be used to adhere the two conductive segments against a PCB.

Figure 5:
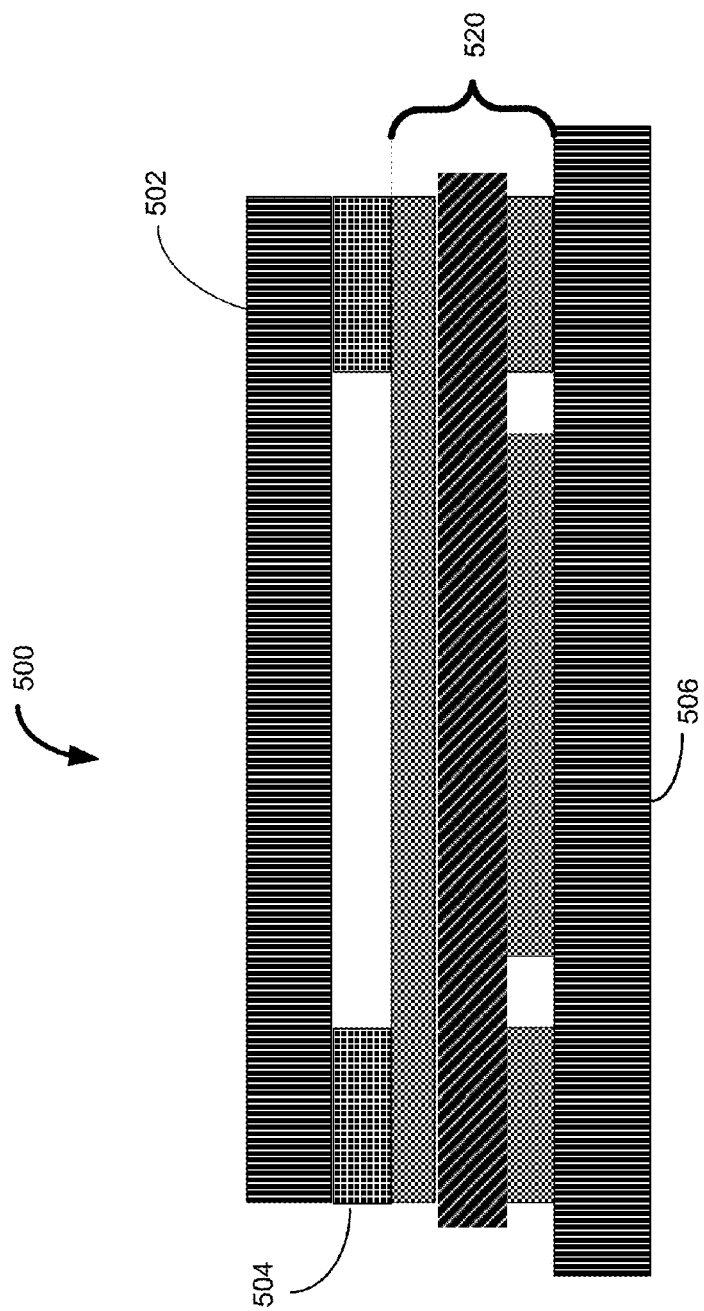
FIG. 5 is a cross-sectional side view diagram illustrating a press force detector system 500 embodiment, according to an example implementation of the disclosed technology.

FIG. 5 depicts a force spreading layer 502 and a mask layer 504 on top of the segmented piezo element 520. According to an example implementation of the disclosed technology, applied forces may be concentrated onto a single section of the piezoelectric layer 301 by means of the mask 504 and force spreading 502 layers. FIG. 5 includes a cross section view through a piezoelectric element assembly embodiment 500 indicating a piezo element 520 having a solid top conductive region (such as the first conductive region 305 of FIGS. 3 and 4) and a two-section bottom conductive region (such as the second conductive region 304 and the third conductive region 306 separated by the non-conductive void region 302, as shown in FIGS. 3 and 4), where the said top and bottom regions are separated by a piezoelectric film (for example, the piezoelectric layer 301 of FIGS. 3 and 4). The top, bottom, and piezoelectric layers may be collectively denoted as a piezo element 520.

In a first example implementation, an outer region of the piezo element 520 may be configured as a mechanically receptive region, while the inner region may be isolated from mechanical stimuli. This configuration may be preferred for certain applications, however, it should be readily understood that in other example embodiments, the inner region may be exposed as the mechanically receptive region, while the outer region be isolated from mechanical stimuli, such as discussed with reference to FIG. 3B and the second embodiment.

In the first example implementation as described above, where the outer region is configured to be receptive to mechanical stimuli, a mask layer 504 may adhere to the outer perimeter of the piezo element 520, which may provide more mechanical stability than the contrary choice. Additionally, by adhering the mask layer 504 to the perimeter of the piezo element 520, the thermally-responsive region may be at least partially isolated from extraneous air currents, radiation, etc.

According to an example implementation the mask layer 504 may define the area over which force is transmitted into the piezo element. Where the mask layer 504 is solid, force is transmitted. Where the mask layer 504 has a void, no force is transmitted. According to an example implementation, the solid areas of the mask layer 504 may be arranged over the region of the piezo element 520 designated to receive both thermal and mechanical stimuli, and voids in the mask layer 504 may be arranged over those regions of the piezo element designated to receive only thermal stimuli.

In an example implementation, the mask layer 504 could be a pressure sensitive adhesive (PSA), such as part numbers 7962 from 3M or 4972 from Tesa. The mask layer 504 may also contain a polyester or other polymer film, or be a composite of several materials. These filmic materials may be conveniently patterned by several methods, including die cutting and laser cutting. Alternately the mask layer 504 may be made of any material that is formable to have voids.

In certain example implementations of the disclosed technology, the mask layer 504 may be substantially incompressible, at least such that the range of expected forces on the mask layer 504 will not alter its masking performance. Furthermore, in certain embodiments, the mask layer 504 should not translate compressive forces into stretch forces, such as a compressible foam may do.

According to various example implementations of the disclosed technology, the mask layer 504 may be of any thickness that supports the masking action. Material and thickness choice for the mask layer 504 may consider thermal properties because ideally the solid and void areas should transmit thermal changes to the element as similarly as possible.

FIG. 5 also shows a force spreading layer 502 that may be provided to concentrate forces onto the solid areas of the mask layer 504, and to prevent forces applied over open areas of the mask layer 504 from reaching the piezo element 520. The force spreading layer 502 may be rigid enough not to deform downward into the void regions of the mask layer 504 and cause undesirable mechanical stimulus of the thermal-only region, even if an external force stimulus is concentrated over a void.

According to certain implementation, the force spreading layer 502 may be made from any formable rigid material. Ideally, the force spreading layer 502 enhances the similarity of heat transmission into the two regions of the piezo element 520. For example, the force spreading layer 502 may be metallic with large specific heat and thermal conductivity. Such material may be utilized to spatially homogenize heat transfer and slow any fast thermal transients.

The force-spreading layer 502, mask layer 504, and piezo element 520 form a vertical stack as shown in FIG. 5. In an example implementation, this stack may rest upon a rigid base 506 that forms a bottom force spreader. The rigid base 506 may be a circuit board to which the piezo element 520 is electrically connected by mere contact or by conductive adhesive, or may be some other surface if the connection method is otherwise arranged.

If the connection method does not require the segmented electrodes to make contact with the rigid base 506, then in certain embodiments, the relative positions of the piezo element 520 and mask layer 504 can be switched. The mask layer 504, for example, may be patterned and aligned as described above, but may be positioned between the piezo element 520 and the bottom rigid base 506. Then the force-spreading layer 502 may apply forces across the entire top of the piezo element 520, but reaction forces from the rigid base 506 may be felt only where the mask layer 504 is solid.

According to an example implementation, a design goal is to have both segments of the piezo element 520 respond identically to thermal transients. Because the solid and void areas of the mask will transfer heat differently, and because the thermal-only segment of the piezo element may see direct thermal radiation from the force-spreading layer, some measures may be taken to meet this goal. One measure is to adjust the relative sizes of the two piezo element segments. For example the relative area ratios of the second conductive region 304 and the third conductive region 306 (as shown in FIGS. 3 and 4) may be configured accordingly.

Figure 6:
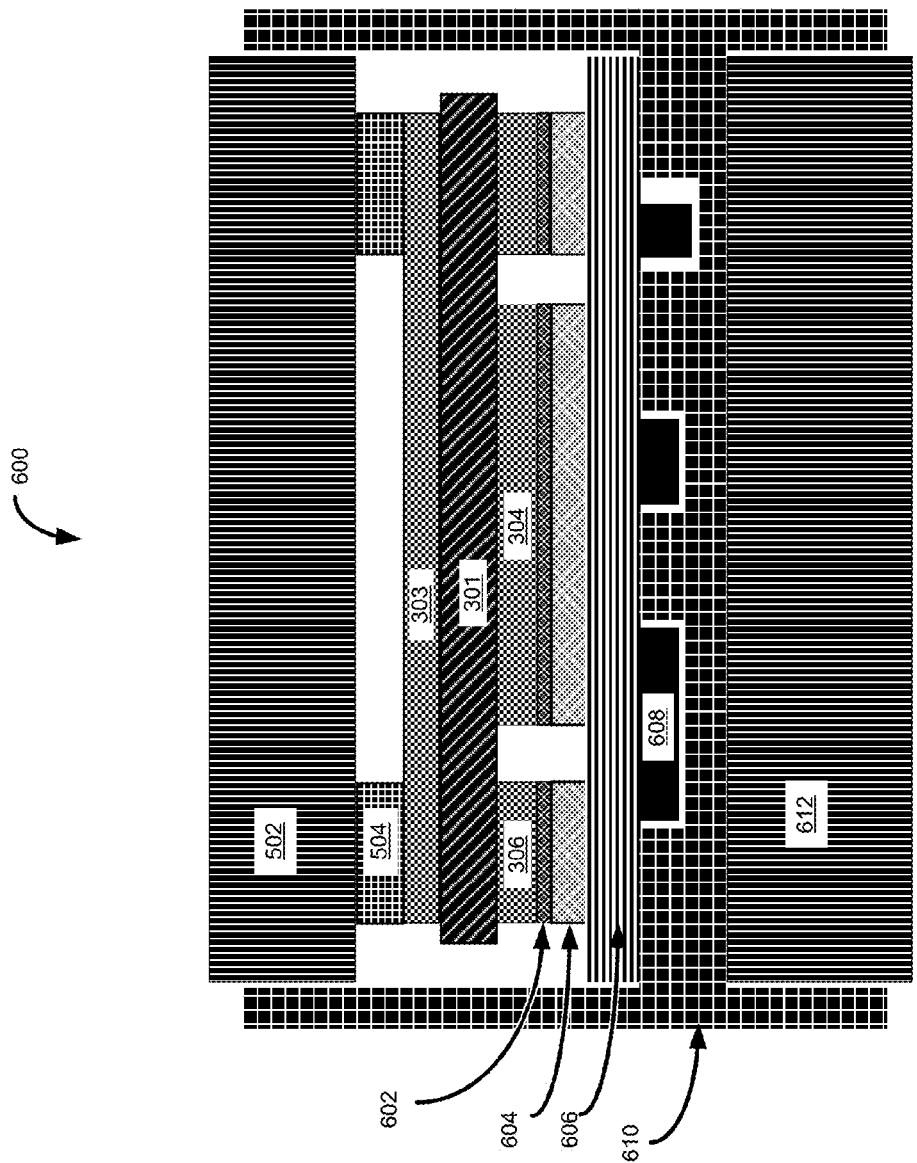
FIG. 6 is a cross-sectional side view diagram illustrating another press force detector system 600 embodiment, according to an example implementation of the disclosed technology.

FIG. 6 depicts a sensor assembly 600 in which the piezo element may be part of a fully packaged and self contained press detection sensor. FIG. 6 illustrates a vertical cross section of an example three dimensional sensor assembly 600 with the z dimension oriented vertically on the page. In the x-y plane, the sensor assembly 600 and its internal elements may be rectangular (as in FIG. 4), but may also have any shape including but not limited to round, donut, etc.

As shown in this example embodiment, the force spreading 502 and mask 504 layers are shown on a top portion of the piezo element. In an example implementation, the piezo element may be connected to conducting pads 604 on the printed circuit board (PCB) 606 using conductive adhesive 602. In an example implementation, the PCB 606 may include circuit components 608 comprising a measurement circuit similar to circuit 200 as shown in FIG. 2. In certain example implementations of the disclosed technology, the above-referenced elements may be set into a protective housing 610. In one example implementation, the housing 610 may be a custom injection-molded plastic part. Cavities in the housing 610 may be configured to receive circuit components 608, for example, on the bottom surface of the PCB 606 to allow the PCB 606 to sit flat. In an example implementation, the underside of the housing 610 may have a rigid force reception plate 612 similar to the force spreading layer 502 on the top of the assembly. In another example implementation, the housing 610 may be made rigid enough to receive and distribute forces without the reception plate 612.

For increasing reliability in adverse environments, the top edge of the housing 610 may be sealed with a substantially flexible caulk or other silicone sealant. The sealant could be introduced during assembly of all parts into the case so that it fills the interstitial space between components, or it may be applied in a bead at between the top lip of the case and the lateral edges of the top force-spreading layer.

Not shown in FIG. 6 are wires, which may include at least power, ground, and signal wires. In one example implementation, these wires could enter through a slot in the side of the housing 610, and soldered to pads on the underside of the PCB.

Figure 6B:
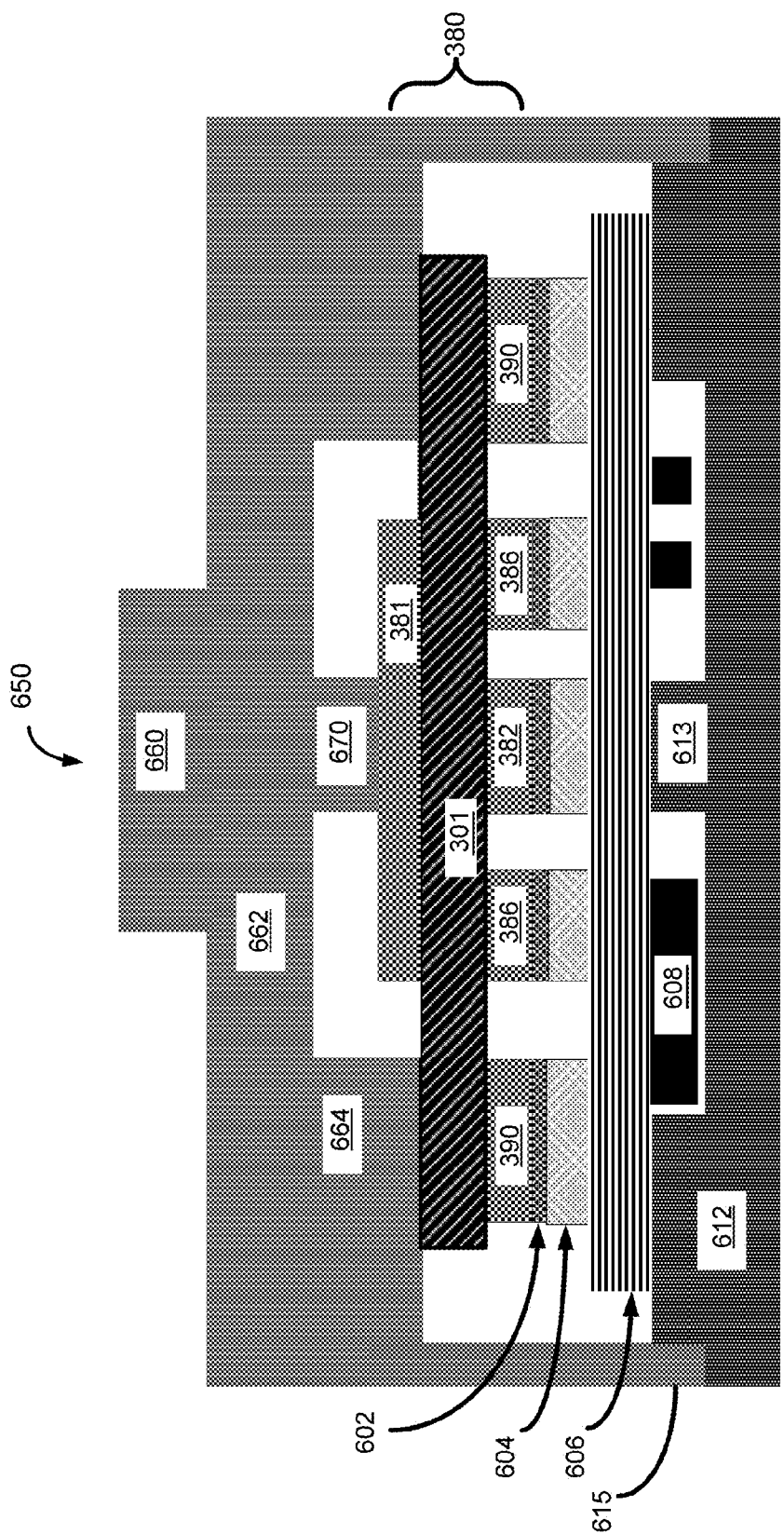
FIG. 6B is a cross-sectional side view diagram illustrating another press force detector system 650 embodiment, according to an example implementation of the disclosed technology.

FIG. 6B is a cross-sectional side view diagram illustrating another press force detector system 650 embodiment, according to an example implementation of the disclosed technology. In this example implementation, the piezoelectric sensor element 380 (as discussed above with reference to FIG. 3B) may be utilized in this example implementation. In this example press force detector system 650 embodiment, a top actuator 660 may be placed in contact with a portion of the piezoelectric sensor element 380, for example, such that a ledge 664 of the top actuator 660 is in communication with a top surface of the piezoelectric layer 301, and such that a top force concentrating region 670 is aligned with the second conductive region 382 and in contact with the first conductive region 381.

In accordance with an example implementation of the disclosed technology, the top actuator 660 may also include a cantilever region 662 that may be configured to allow a force exerted on the top actuator 660 to flex the cantilever region 662 such that the top force concentrating region 670 compresses the piezoelectric layer 301 primarily in the region under (or aligned with) the top force concentrating region 670. As previously discussed, and according to an example implementation of the disclosed technology, thermal stimuli transferred through the top actuator 660 and top force concentrating region 670 may dissipate and spread via the first conductive region 381 to those areas of the piezoelectric layer 301 corresponding to the second conductive region 382 and third conductive region 386, for example, so that a thermal response may be minimized.

In accordance with an example implementation of the disclosed technology, and as shown in FIG. 6B, the top actuator 660 may also include a support region 615 on the sides that may be connected with a rear force reception plate 612, for example, to hold the press force detector system 650 together. In an example implementation, this may allow the top actuator 660 to hold the piezoelectric sensor element 380 and PCB 606 in compression against the rear force reception plate 612, which may cause the top force concentrating region 670 to press against the first conductive region 381 (to spread thermal excitation) while an actuation force that further compresses the piezoelectric layer 301 is essentially confined to the middle region of the piezoelectric layer 301.

In accordance with an example implementation of the disclosed technology, when the top actuator 660 is connected to the rear force reception plate 612 (for example, via the support 615) the ledge 664 may act to keep the fourth conductive region 390 subjected to mechanical pre-load force to keep ensure bonding of the PCB electrodes 604 against the fourth conductive region 390, for example, via the conductive adhesive 602. In accordance with an example implementation of the disclosed technology, mechanical pre-load may be applied when the top actuator 660 and the rear force reception plate 612 are bonded together using ultrasonic welding, adhesive bonding, or other means.

In an example implementation, one or more of the second conductive region 382, third conductive region 386, and forth conductive region 390 may be electrically connected to corresponding electrodes 604 of a printed circuit board (PCB) 606. In one example implementation, the conductive regions may be connected to the electrodes 604 by a conductive adhesive 602. In certain example implementations, the PCB 606 can have additional electronic components 608 installed on it (such as the electrical components as shown in FIG. 2B). In accordance with an example implementation of the disclosed technology, a rear force reception plate 612 may at least partially support a portion of the PCB 606, and it may include cutout or recessed areas to allow room for electrical components 608 on the PCB 606. In an example implementation, the rear force reception plate 612 may include a bottom force-concentrating region 613 near a central portion, and aligned with the second conductive region 382 of the piezoelectric sensor element 380. In an example implementation, one or more of the top force concentrating region 670 and bottom force-concentrating region 613 may comprise a raised shape, such as a cross, or other pattern.

In accordance with an example implementation of the disclosed technology, the piezoelectric layer 301 may have a thickness between about 50 microns and about 100 microns. In certain example implementations, the manufacturing tolerances for the various housing components, such as the top actuator 660 and the rear force reception plate 612 may be +/−50 microns. Thus, certain example implementations of the disclosed technology may utilize the preloading, as discussed above, to avoid gaps in the various layers while ensuring good electrical contact between the layers.

In accordance with an example implementation of the disclosed technology, mechanical input force damping and other properties of the press force detector can be controlled by geometric design and materials selection. For example, the Young's Modulus properties of the top actuator 660, the cantilever region 662, and/or the ledge region 664 may be selected to provide a predetermined stiffness in certain regions, while providing flexibility in others. According to an example implementation of the disclosed technology, the top force concentrating region 670 and/or bottom force-concentrating region 613 may be much stiffer than the first conductive region 381 so that when a force stimulus is applied, only the inner center region of the piezoelectric layer 301 will be compressed.

FIG. 6B1 is a cross-sectional side view diagram illustrating another press force detector system 680 (prior to packaging), according to an example implementation of the disclosed technology. This example implementation may be similar to the press force detector system 650 embodiment, as described above and shown in FIG. 6B, but without necessarily requiring a rear force reception plate (such as plate 612 and/or the bottom force-concentrating region 613 as shown in FIG. 6B) since the function of these components may be handled by the packaging enclosure, and will be discussed below with reference to FIGS. 6B2-6B4. Additionally, and according to an example implementation of the disclosed technology, the ledge region (such as ledge 664 as shown in FIG. 6B) may be eliminated to avoid or reduce mechanical misalignment. For example, the elimination of the ledge may help reduce the tolerance and precision requirements of the top actuator 660. Furthermore, removal of the ledge may help increase the force transfer sensitivity, as less material will need to be compressed to activate the detector. In an example implementation, the PCB 606 associated with the press force detector system 680 may include (or be in communication with) circuit components 609 comprising the measurement circuit similar to the circuit 251 as shown in FIG. 2B1.

According to an example implementation of the disclosed technology, the press force detector system 680 may include an adhesive and/or gasket 699 disposed between the top actuator 660 (and/or the cantilever region 662) and the PCB 606. In certain example implementations, the adhesive/gasket 699 may provide bonding for additional stability and/or additional environmental protection for the piezoelectric sensor element assembly 694.

Referring again to FIG. 6B1, and in accordance with an example implementation of the disclosed technology, the press force detector system 680 may include a spacer 671 between the top actuator 660 and the first conductive region 381 of the of the piezoelectric sensor element assembly 694. The spacer 671 may act as a top force concentrating region (similar to the top force concentrating region 670 shown in FIG. 6B). In an example implementation, the spacer 671 may be made from a selected material having mechanical properties that can differ from the material of the top actuator 660 and/or the cantilever region 662. In an example implementation, the spacer 671 may provide a mechanical pre-load and/or static force to ensure good physical contact between the top housing and the piezoelectric element. In an example implementation, the spacer 671 may provide force damping in applications where the external force stimulus exceeds the force detection range of the piezoelectric element. In some example implementations, the spacer 671 may be secured in place with an adhesive or other mechanical bonding method.

According to an example implementation of the disclosed technology, the spacer 671 material may be characterized in terms of Young's Modulus (or Shore-A Durometer) that may differ from the Young's Modulus of the external packaging/molding and/or and the top cover or actuator 660. In certain example implementations, the spacer 671 material may be selected for the desired mechanical travel, displacement, and/or compression when the protruding top portion actuator 660 is pressed directly by an actuator or person. In certain example implementations, the protruding top portion of the top actuator 660 may not be present, or may be recessed to avoid accidental actuation. In some example implementations, the Young's Modulus of the spacer 671 may be in the range of about 0.01 GPa to about 0.1 GPa (or having a similar stress-strain curve as rubber). In some example implementations, the Young's Modulus of the spacer 671 may be in the range of about 0.1 GPa to about 1.0 GPa (or having a similar stress-strain curve as low-density polyethylene). In some example implementations, the Young's Modulus of the spacer 671 may be in the range of about 0.5 GPa to about 1.0 GPa (or having a similar stress-strain curve as high-density polyethylene). In certain example implementations, the Young's Modulus of the spacer 671 may be in the range of about 1.0 GPa to about 1.5 GPa (or having a similar stress-strain curve as polypropylene). In certain example implementations, the Young's Modulus of the spacer 671 may be in the range of about 1.5 GPa to about 3.0 GPa (or having a similar stress-strain curve as PET, nylon, or leather). In applications in which maximum force transfer is desired, a rigid material in the range of about 3.0 GPa to about 300 GPa (or greater) such as acrylic, carbon fiber, or metal may be utilized for the spacer 671. In certain example implementations, the Young's Modulus of the spacer 671 may be in the range of about 0.1 GPa to about 2.0 GPa.

FIG. 6B2 is a cross-sectional side view diagram illustrating a packaged press force detector system 690 embodiment, according to an example implementation of the disclosed technology. In certain implementations, the piezoelectric sensor element assembly 694 may be installed in the enclosure 695. In other example implementations, the enclosure 695 may be molded around the piezoelectric sensor element assembly 694, for example, to provide encapsulation around the assembly 694. In certain example implementations, the enclosure 695 may include a strain relief 697 for routing and protecting the wiring 698. In certain example implementations, the enclosure 695 may include encapsulation material or standoffs 696 for supporting the PCB 606 of the piezoelectric sensor element assembly 694, and for positioning the press force detector components within the enclosure 695. In this regard, the standoffs 696 (and/or encapsulation material or other form-filling materials associated with the molded enclosure 695) may act as a bottom force-concentrating region, as discussed previously. According to an example implementation of the disclosed technology, external molding may be utilized to achieve an application-specific physical form factor (shape and size), particularly in cases where precise mechanical fitting is desired or required.

In certain implementations, the enclosure 695 may include optional features such as the tapered regions 691 near and/or integrated with the top actuator 660. In certain example implementations, the top actuator 660 may protrude through an aperture in the enclosure 695. In some implementations, the top actuator 660 may be integrated with the enclosure 695. For example, in certain implementations, the top actuator 660 may serve as the top portion of the enclosure 695. In this example implementation, the top actuator 660 may be sealed to a bottom portion of the enclosure 695 and may utilize standoffs 696, encapsulation, adhesive, and/or gaskets 699 to align and/or seal the press force detector system 690 and to protect the piezoelectric sensor element assembly 694.

FIG. 6B3 is a 3D exploded view illustration of a press force detector system 690, according to an example implementation of the disclosed technology. The spacer 671, as discussed above, is depicted in the dashed circle.

FIG. 6B4 is a 3D illustration of an assembled press force detector system 690, according to an example implementation of the disclosed technology. With reference to FIGS. 2B1 and 6B1-6B4, the use of the enclosure 695 (with associated packing, molding, and/or encapsulation) along with the distributed electronics circuitry may allow for reconfigurable force sensing transducers with temperature compensation. For example, the use of external encapsulation/molding may be utilized to achieve different external shape/size/volume within constraints to address applications that may benefit from or require precise mechanical assembly/fitting of the piezoelectric sensor element assembly 694. In certain example implementations, different external encapsulation/molding can also be customized for harsh environmental conditions. According to an example implementation of the disclosed technology, the same internal transducer module (such as the press force detector system 680 shown in FIG. 6B1) may be produced for a plurality of applications, and external encapsulation/molding 695 may be modified for specific applications. Furthermore, and as discussed with reference to FIG. 2B1, the electronics may be reconfigurable and/or modular to provide compatibility with different microcontrollers and/or electronic interfaces.

FIG. 6C is a partially exploded cross-sectional side view diagram illustrating another press force detector system 665 embodiment, according to an example implementation of the disclosed technology. In this example implementation, rear force reception plate 612 may include the support 616 which may be used to connect to the top actuator 661 to provide the preloading, as discussed above with reference to FIG. 6B. In certain example implementations, the separate top actuator portion 661 may be bonded to the rest of the press force detector system 665 either during assembly or after assembly, for example, in the field.

Figure 6D:
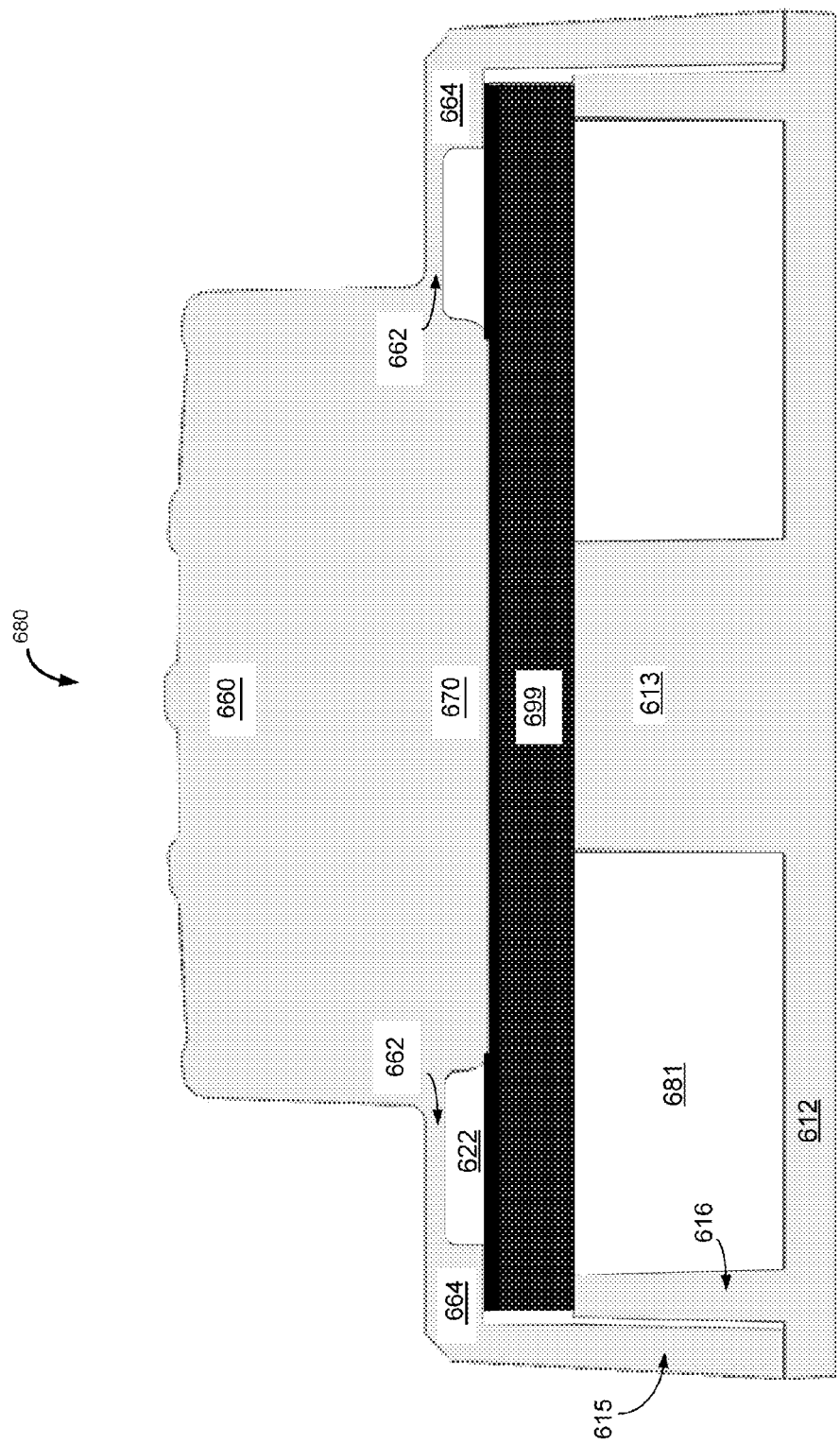
FIG. 6D is a cross-sectional side view diagram illustrating another press force detector system 680 embodiment, according to an example implementation of the disclosed technology.

FIG. 6D is a cross-sectional side view diagram illustrating another press detector system 680 embodiment, according to an example implementation of the disclosed technology. In contrast to the depiction of the detector system 650 shown in FIG. 6B, which is not necessarily to scale, FIG. 6D depicts an example scale of the various components relative to one another, as may be used in an actual sensor. For example, a piezoelectric sensor assembly 699, as shown in FIG. 6D may include all (or most) of the corresponding components of a piezoelectric sensor element (such as piezoelectric sensor element 380 and associated components 381 382 386 390 602 604 606, as shown in FIG. 6B).

In this example press force detector system 680 embodiment, a top actuator 660 may be placed in contact with a portion of the piezoelectric sensor assembly 699, for example, such that a top force-concentrating region 670 is aligned with the bottom force-concentrating region 613. In an example implementation, one or more of the top force-concentrating region 670 and bottom force-concentrating region 613 may comprise a raised shape, such as a cross, or other pattern (not shown) to further concentrate an applied press force to a desired region of the piezoelectric sensor assembly 699 (for example, within a central region) as previously discussed.

In accordance with an example implementation of the disclosed technology, the top actuator 660 of the press force detector system 680 may also include cantilever regions 662, as previously discussed. The cantilever regions 662 that may be configured to allow a force exerted on the top actuator 660 to flex the cantilever region 662, for example, to provide the compression force to a desired region of the piezoelectric sensor assembly 699, while maintaining structural integrity of the system 680. In one example implementation, one or more void region 622 may be defined in the top actuator 660. For example, the dimensions of the void region 622, together with the dimensions of the cantilever region 662, may be configured to provide a desired stiffness and flexibility.

In accordance with an example implementation of the disclosed technology, the top actuator 660 of the press force detector system 680 may include a ledge portion 664, as previously described. In one example implementation, the ledge portion 664 may be configured for communication with a top surface of the piezoelectric sensor assembly 699. In one example implementation, the ledge portion 664 may hold an outer portion of the piezoelectric sensor assembly 699 in compression against a lower support region 616. In one example implementation, an outer support region 615 may be bonded to the rigid force reception plate 612 to seal the unit and/or to provide preloading.

According to an example implementation of the disclosed technology, one or more cavity portion of the press force detector system 678 (and/or the previously described press force detector systems 600 650 665) may be filled with an encapsulant 681, for example to keep out humidity and/or to keep the sensor waterproof. For example, the air cavity in the bottom between the reception plate 612 and the components on the printed circuit board (as part of the piezoelectric sensor assembly 699) may be encapsulated 681. In certain example implementations, the void regions below the sensor element may be encapsulated 681. In certain example implementations, the encapsulant 681 may have a different Young's modulus compared to the surrounding materials. In certain example implementations, the top air cavity can be filled with an elastomeric material such that minimum force will be transferred to certain portions of the piezoelectric sensor assembly 699, for example, except for the region co-aligned with the top force-concentrating region 670 and bottom force-concentrating region 613. In practice, the top air cavities may be filled with air.

In certain example implementations, the encapsulant 681 may be utilized to keep out humidity and/or to keep the sensor waterproof. For example, the air cavity in the bottom between the reception plate 612 and the printed circuit board of the piezoelectric sensor assembly 699 may be encapsulated 681. As previously discussed, the one or more cavity portions may also include electronic components (not shown).

Figure 7:
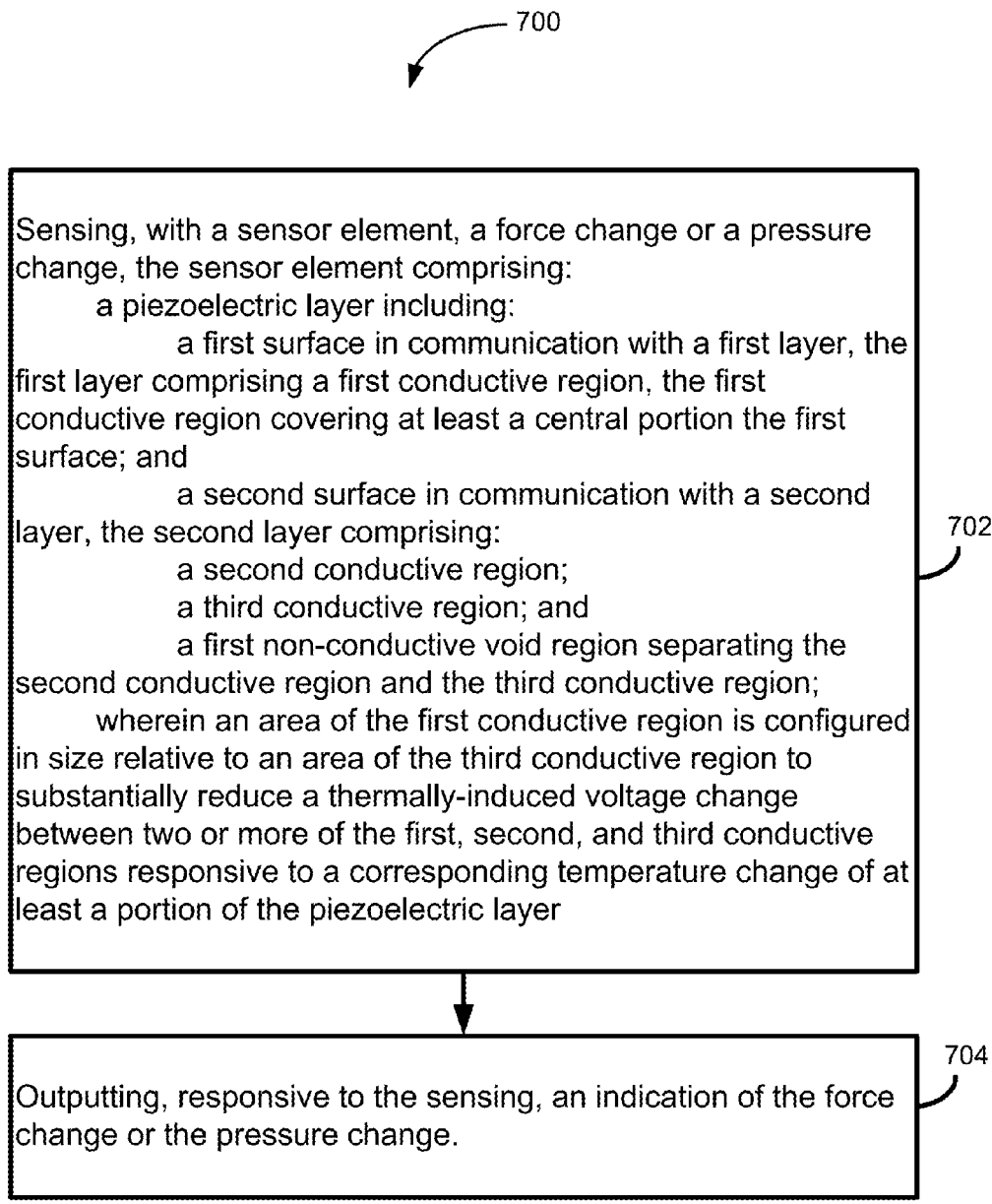
FIG. 7 is a method 700, according to an example implementation of the disclosed technology.

FIG. 7 is a method 700, according to an example implementation of the disclosed technology. In step 702, the method 700 may include sensing, with a sensor element, a force change and/or a pressure change, the sensor element comprising: a piezoelectric layer including: a first surface in communication with a first layer, the first layer comprising a first conductive region; and a second surface in communication with a second layer, the second layer comprising: a second conductive region; a third conductive region; and a first non-conductive void region separating the second conductive region and the third conductive region; wherein an area of the first conductive region is configured in size relative to an area of the third conductive region to substantially reduce a thermally-induced voltage change between two or more of the first, second, and third conductive regions responsive to a corresponding temperature change of at least a portion of the piezoelectric layer. In step 704, the method 700 may include outputting, responsive to the sensing, an indication of the force change or the pressure change.

In an example implementation, a thermal stimulus applied to a portion of the first conductive region 381 may be spread to portions of the piezoelectric layer 301 corresponding to an overlap of the first conductive region 381 with the second 382 and the third 386 conductive regions to reduce the thermally-induced voltage change.

According to certain example implementations of the disclosed technology, the force and/or pressure change detected by the sensor element may be converted to a measurable indication and/or signal for output, as discussed above with reference to FIG. 2. For example, a charge separation on the piezoelectric layer 301 may be induced by mechanical stimuli (such as a force or pressure change) and such charge separation may in turn, induce a current in a circuit connected to both sides of the piezoelectric layer 301. According to certain example implementations of the disclosed technology, the induced current may be utilized as an input to one or more electronics circuits, where it may be converted (for example, to a voltage), amplified, conditioned, filtered, rectified, measured, etc, and utilized for producing an output indication or signal. Other electronic circuits known to those having skill in the art may be utilized without departing from the scope of the disclosed embodiments.

In an example implementation of the disclosed technology, the second conductive region 304 is an inner region, and wherein the third conductive region 306 is an outer region that at least partially circumscribes the second conductive region 304.

In an example implementation, the piezoelectric layer 301 is configured to produce a measurable voltage differential 340, 350, 360 between two or more of the first 305, second 304 and third conductive regions 306 responsive to a corresponding force change or pressure change exerted on the first surface 310 or the second surface 330. In one example implementation, the first conductive region 305 substantially covers the first surface 310.

According to an example implementation, one or more of the first 305, second 304 and third conductive regions 306 comprise a conductive material layer in intimate contact with the piezoelectric layer 301. In certain example embodiments, the conductive material may be an organic material, a polymer, a metal, a transparent conductive metal-oxide, graphene, carbon nanotubes (CNT), metal nanorods, metal particles, or metal oxide particles, or a mixture thereof. In an example implementation, one or more of the first 305, second 304 and third conductive regions 306 comprise a conductive adhesive in intimate contact with the piezoelectric layer 301.

Certain example implementations may further include a force spreading layer 502; a mask layer 504 in communication with at least a portion of the force spreading layer 502; and a piezoelectric element 320 in communication with at least a portion of the mask layer 504.

As discussed with reference to FIGS. 6B-6E, the disclosed technology can include a sensor element embodiment having a piezoelectric layer 301 that may include a first surface 310 in communication with a first layer 303, the first layer 303 including a first conductive region 381, where the first conductive region 381 covers at least a central portion the first surface 310. The piezoelectric layer 301 can include a second surface 330 in communication with a second layer 307. The second layer 307 may include a second conductive region 382, a third conductive region 386, and a first non-conductive void region 384 separating the second conductive region 382 and the third conductive region 386. In an example implementation, an area of the first conductive region 381 is configured in size relative to an area of the third conductive region to substantially reduce a thermally-induced voltage change between two or more of the first 381, second 382 and third 386 conductive regions responsive to a corresponding temperature change of at least a portion of the piezoelectric layer 301.

In certain example implementations, a thermal stimulus applied to a portion of the first conductive region 381 is spread to portions of the piezoelectric layer 301 corresponding to an overlap of the first conductive region 381 with the second 382 and the third 386 conductive regions to reduce the thermally-induced voltage change.

In certain example implementations, the second conductive region 382 is an inner region, and the third conductive region 386 is an outer region that at least partially circumscribes the second conductive region 382.

In an example implementation, the piezoelectric layer 301 is configured to produce a measurable voltage differential between two or more of the first 381, second 382 and third 386 conductive regions responsive to a corresponding force change or pressure change exerted between the first surface 310 and the second surface 330.

In an example implementation, the second layer 307 further includes a fourth conductive region 390 surrounding the third conductive region 386, and a second non-conductive void region 388 at least partially separating the fourth conductive region 390 and the third conductive region 386. In one example implementation, the fourth conductive region 390 is in electrical communication with the third conductive region 386.

In an example implementation, the second conductive region 382 is disposed in a central portion of the sensor element, the first non-conductive void region 384 surrounds the second conductive region 382, and the third conductive region 386 surrounds the first non-conductive void region 384.

In an example implementation, one or more of the first, second and third conductive regions can include a conductive material in intimate contact with the piezoelectric layer. In certain example implementations, the conductive material may be an isotropic conductive adhesive.

As discussed with reference to FIGS. 6B-6E, the disclosed technology can include a sensor system that includes a force concentrating layer 660, a force reception plate 612; and a piezoelectric element 699 in communication with at least a portion of the force concentrating layer 660 and the force reception plate 612. The piezoelectric element 699 can include the a piezoelectric layer 301 with associated components, as described above.

In certain example implementations, piezoelectric element 699 of the sensor system can further include a printed circuit board 606 having corresponding electrodes 604 in electrical communication with at least the second conductive region 382 and the third conductive region 386.

In certain example implementations, a conductive adhesive 602 may join the electrodes 604 with at least the second 382 and third 386 conductive regions.

In accordance with an example implementation of the disclosed technology, the force concentrating layer 660 may be configured to transfer an applied pressure to a central portion of the first conductive region 381 and a corresponding portion of the piezoelectric layer 301.

As discussed, a thermal stimulus applied to a portion of the first conductive region 381 may be spread to portions of the piezoelectric layer 301 corresponding to an overlap of the first conductive region 381 with the second 382 and the third 386 conductive regions to reduce the thermally-induced voltage change.

In certain example implementations, the second conductive region 382 is an inner region, and wherein the third conductive region 386 is an outer region that at least partially circumscribes the second conductive region 382.

In an example implementation, the piezoelectric layer 301 is configured to produce a measurable voltage differential between two or more of the first 381, second 382 and third 386 conductive regions responsive to a corresponding force change or pressure change exerted between the first surface 310 and the second surface 330.

In certain example implementations, the second layer 307 may further include a fourth conductive region 390 surrounding the third conductive region 386, and a second non-conductive void region 388 at least partially separating the fourth conductive region 390 and the third conductive region 386. In an example implementation, the fourth conductive region 390 is in electrical communication with the third conductive region 386.

In an example implementation, the second conductive region 382 is disposed in a central portion of the sensor element, the first non-conductive void region 384 surrounds the second conductive region 382, and the third conductive region 386 surrounds the first non-conductive void region 384.

In certain example implementations, one or more of the first, second and third conductive regions comprise a conductive material in intimate contact with the piezoelectric layer. According to an example implementation of the disclosed technology, the conductive material can include one or more of organic material, a polymer, a metal, a transparent conductive metal-oxide, graphene, carbon nanotubes (CNT), metal nanorods, metal particles, or metal oxide particles, or a mixture thereof.

Figure 8:
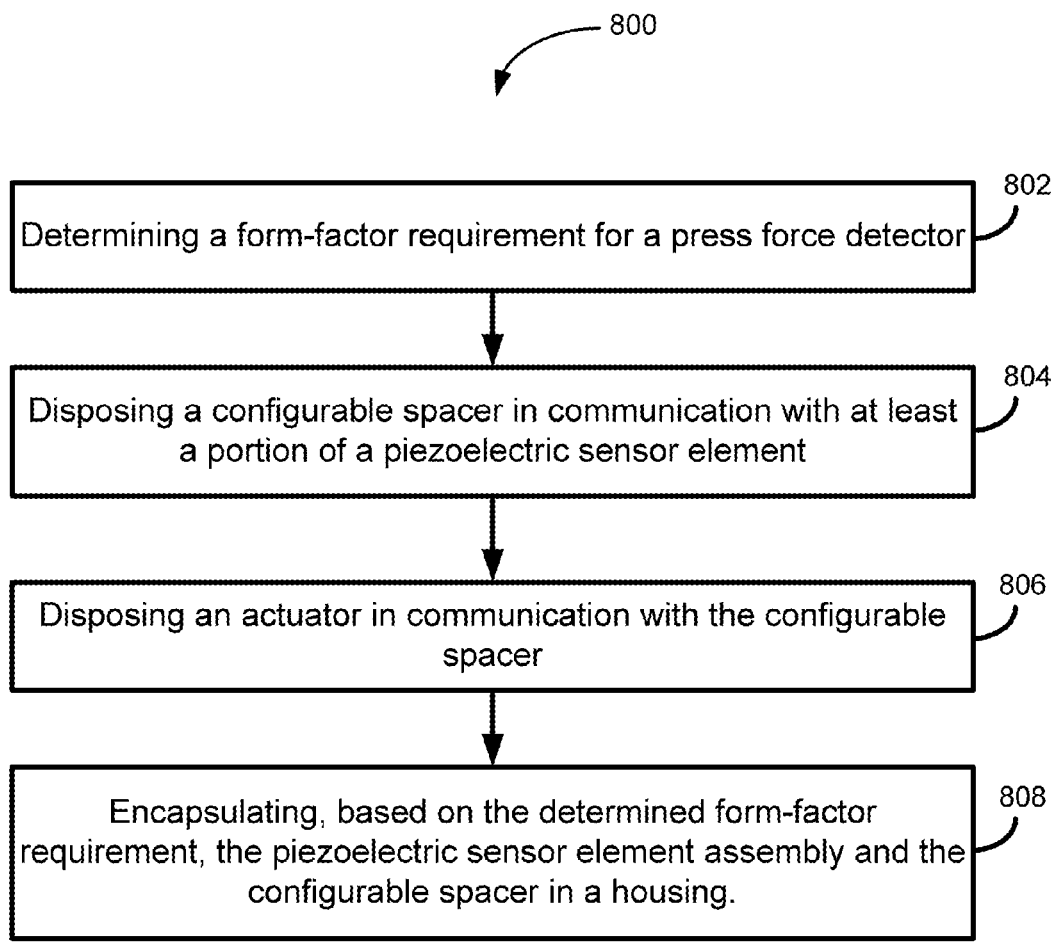
FIG. 8 is a method 800, according to an example implementation of the disclosed technology.

FIG. 8 is a method 800, according to an example implementation of the disclosed technology. In step 802, the method 800 may include determining a form-factor requirement for a press force detector. In step 804, the method 800 may include disposing a configurable spacer in communication with at least a portion of a piezoelectric sensor element. In step 806, the method 800 may include disposing an actuator in communication with the configurable spacer. In step 808, the method 800 may include encapsulating, based on the determined form-factor requirement, the piezoelectric sensor element assembly and the configurable spacer in a housing.

In certain example implementations, the piezoelectric sensor element assembly can include a piezoelectric layer having a first surface and a second surface; a first conductive region disposed on at least a central portion the first surface of the piezoelectric layer; a second conductive region disposed on at least a central portion of the second surface of the piezoelectric layer; and a temperature sensor configured to measure a temperature of at least a portion of the piezoelectric sensor element assembly.

In certain example implementations, the actuator may be configured to receive an external force, and the spacer may be configured to transmit at least a portion of the received external force to at least a portion of the first conductive region of the piezoelectric sensor element assembly.

In certain example implementations, the housing may include at least a portion of the actuator.

According to an example implementation of the disclosed technology, the configurable spacer may be characterized by a Young's Modulus in a range of about 0.5 GPa to about 1.5 GPa. According to an example implementation of the disclosed technology, the configurable spacer is characterized by a Young's Modulus in a range of about 0.1 GPa to about 2.0 GPa.

In accordance with an example implementation, the disclosed technology includes configurable press force detector system that can include a housing 695 and a piezoelectric sensor element assembly 694 disposed in the housing 695. In an example implementation, the piezoelectric sensor element assembly 694 can include a piezoelectric layer 301 having a first surface and a second surface; a first conductive region 381 disposed on at least a central portion the first surface of the piezoelectric layer 301; a second conductive region 382 disposed on at least a central portion of the second surface of the piezoelectric layer 301; and a temperature sensor R8, (see FIG. 2B1) configured to measure a temperature of at least a portion of the piezoelectric sensor element assembly 694. The piezoelectric sensor element assembly 694 can include a configurable spacer 671 in communication with the first conductive region 381 of the piezoelectric sensor element assembly 694 and an actuator 690 in communication with the configurable spacer 671. In an example implementation, the actuator 690 may be configured to receive an external force, and the spacer 671 may be configured to transmit at least a portion of the received external force to at least a portion of the first conductive region 381 of the piezoelectric sensor element assembly 694. According to an example implementation of the disclosed technology, an area of the first conductive region 381 may be configured in size relative to at least an area of the second conductive region 382 to substantially reduce a thermally-induced voltage change between the first and second conductive regions responsive to a corresponding temperature change of at least a portion of the piezoelectric layer. In an example implementation, the piezoelectric sensor element assembly 694 may be configured to output an indication of the received external force, and to output an indication of a temperature of at least a portion of the piezoelectric sensor assembly 694.

In an example implementation, the a piezoelectric sensor element assembly 694 can further include a third conductive region 386 disposed on the second surface of the piezoelectric layer 301, the third conductive region 386 may be separated from the second conductive region 382 by a first non-conductive void region to further reduce a thermally-induced voltage change between two or more of the first, second and third conductive regions responsive to a corresponding temperature change of at least a portion of the piezoelectric layer.

In an example implementation, a thermal stimulus applied to a portion of the first conductive region may be spread to portions of the piezoelectric layer corresponding to an overlap of the first conductive region with the second and the third conductive regions to reduce the thermally-induced voltage change.

In an example implementation, the second conductive region is an inner region, and the third conductive region is an outer region that at least partially circumscribes the second conductive region.

According to an example implementation of the disclosed technology, the configurable press force detector system may further include a fourth conductive region surrounding the third conductive region, and a second non-conductive void region at least partially separating the fourth conductive region and the third conductive region. In certain example implementations, the fourth conductive region is in electrical communication with the third conductive region.

According to an example implementation of the disclosed technology, the piezoelectric layer may be configured to produce a measurable voltage differential between at least the first and second conductive regions responsive to a corresponding force change or pressure change exerted between the first surface and the second surface.

In certain example implementations, the housing 695 may include at least a portion of the actuator 690.

In certain example implementations, the housing 695 is configurable for a pre-determined form-factor.

In certain example implementations, the housing 695 can include one or more of standoffs and encapsulation material for supporting at least a portion of the piezoelectric sensor element assembly 694.

In certain example implementations, the configurable press force detector system may further include electronic circuitry 609 configured to communicate with and electronic measurement system 252.

In certain example implementations, the piezoelectric sensor element assembly can further include a printed circuit board having corresponding electrodes in electrical communication with at least the second conductive region.

In certain example implementations, a conductive adhesive 602 may be utilized to join the electrodes with at least the second and third conductive regions.

In certain example implementations, the configurable spacer 671 is characterized by a Young's Modulus in a range of about 0.1 GPa to about 1.0 GPa.

In certain example implementations, the configurable spacer 671 is characterized by a Young's Modulus in a range of about 1.0 GPa to about 1.5 GPa.

In certain example implementations, the configurable spacer 671 is characterized by a Young's Modulus in a range of about 1.5 GPa to about 3.0 GPa.

In certain example implementations, the configurable spacer 671 is characterized by a Young's Modulus in a range of about 3.0 GPa to about 300 GPa.

In certain example implementations, the configurable spacer 671 is characterized by a Young's Modulus in a range of about 0.1 GPa to about 2.0 GPa.

According to example implementations, certain technical effects can be provided, such as creating certain systems and methods that provide a force and/or pressure sensor that has a reduced thermal response. Example implementations of the disclosed technology can provide the further technical effects of providing systems and methods for reducing the size and/or cost associated with manufacturing a force and/or pressure sensor.

Throughout the specification and the claims, numerous specific details are set forth. However, it is to be understood that implementations of the disclosed technology may be practiced without these specific details. In other instances, well-known methods, structures and techniques have not been shown in detail in order not to obscure an understanding of this description. References to "one implementation," "an implementation," "example implementation," "various implementations," etc., indicate that the implementation(s) of the disclosed technology so described may include a particular feature, structure, or characteristic, but not every implementation necessarily includes the particular feature, structure, or characteristic. Further, repeated use of the phrase "in one implementation" does not necessarily refer to the same implementation, although it may.

Throughout the specification and the claims, the following terms take at least the meanings explicitly associated herein, unless the context clearly dictates otherwise. The term "connected" means that one function, feature, structure, or characteristic is directly joined to or in communication with another function, feature, structure, or characteristic. The term "coupled" means that one function, feature, structure, or characteristic is directly or indirectly joined to or in communication with another function, feature, structure, or characteristic. The term "or" is intended to mean an inclusive "or." Further, the terms "a," "an," and "the" are intended to mean one or more unless specified otherwise or clear from the context to be directed to a singular form.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A configurable press force detector system comprising:
   a housing;
   a piezoelectric sensor element assembly disposed in the housing, the piezoelectric sensor element assembly comprising:
      a piezoelectric layer having a first surface and a second surface;
      a first conductive region disposed on at least a central portion the first surface of the piezoelectric layer;
      a second conductive region disposed on at least a central portion of the second surface of the piezoelectric layer; and
      a temperature sensor configured to measure a temperature of at least a portion of the piezoelectric sensor element assembly;
   a configurable spacer in communication with the first conductive region of the piezoelectric sensor element assembly;
   an actuator in communication with the configurable spacer, wherein the actuator is configured to receive an external force, and wherein the spacer is configured to transmit at least a portion of the received external force to at least a portion of the first conductive region of the piezoelectric sensor element assembly; and
   wherein an area of the first conductive region is configured in size relative to at least an area of the second conductive region to substantially reduce a thermally-induced voltage change between the first and second conductive regions responsive to a corresponding temperature change of at least a portion of the piezoelectric layer;
   wherein the piezoelectric sensor element assembly is configured to output an indication of the received external force, and to output an indication of a temperature of at least a portion of the piezoelectric sensor assembly.

2. The configurable press force detector system of claim 1, wherein the a piezoelectric sensor element assembly further comprises a third conductive region disposed on the second surface of the piezoelectric layer, the third conductive region separated from the second conductive region by a first non-conductive void region to further reduce a thermally-induced voltage change between two or more of the first, second and third conductive regions responsive to a corresponding temperature change of at least a portion of the piezoelectric layer.

3. The configurable press force detector system of claim 2, wherein a thermal stimulus applied to a portion of the first conductive region is spread to portions of the piezoelectric layer corresponding to an overlap of the first conductive region with the second and the third conductive regions to reduce the thermally-induced voltage change.

4. The configurable press force detector system of claim 2, wherein the second conductive region is an inner region, and wherein the third conductive region is an outer region that at least partially circumscribes the second conductive region.

5. The configurable press force detector system of claim 2, further comprising:
a fourth conductive region surrounding the third conductive region; and
a second non-conductive void region at least partially separating the fourth conductive region and the third conductive region;
wherein the fourth conductive region is in electrical communication with the third conductive region.

6. The configurable press force detector system of claim 1, wherein the piezoelectric layer is configured to produce a measurable voltage differential between at least the first and second conductive regions responsive to a corresponding force change or pressure change exerted between the first surface and the second surface.

7. The configurable press force detector system of claim 1, wherein the housing comprises at least a portion of the actuator.

8. The configurable press force detector system of claim 1, wherein the housing is configurable for a given form-factor.

9. The configurable press force detector system of claim 1, wherein the housing comprises one or more of standoffs and encapsulation material for supporting at least a portion of the piezoelectric sensor element assembly.

10. The configurable press force detector system of claim 1, further comprising electronic circuitry configured to communicate with and electronic measurement system.

11. The configurable press force detector system of claim 1, wherein the piezoelectric sensor element assembly further comprises a printed circuit board having corresponding electrodes in electrical communication with at least the second conductive region.

12. The configurable press force detector system of claim 11, wherein a conductive adhesive joins the electrodes with at least the second and third conductive regions.

13. The configurable press force detector system of claim 1, wherein the configurable spacer is characterized by a Young's Modulus in a range of about 0.1 GPa to about 1.0 GPa.

14. The configurable press force detector system of claim 1, wherein the configurable spacer is characterized by a Young's Modulus in a range of about 1.0 GPa to about 1.5 GPa.

15. The configurable press force detector system of claim 1, wherein the configurable spacer is characterized by a Young's Modulus in a range of about 1.5 GPa to about 3.0 GPa.

16. The configurable press force detector system of claim 1, wherein the configurable spacer is characterized by a Young's Modulus in a range of about 3.0 GPa to about 300 GPa.

17. A method comprising:
determining a form-factor requirement for a press force detector;
disposing a configurable spacer in communication with at least a portion of a piezoelectric sensor element;
disposing an actuator in communication with the configurable spacer; and
encapsulating, based on the determined form-factor requirement, the piezoelectric sensor element assembly and the configurable spacer in a housing, wherein the piezoelectric sensor element assembly comprises:
a piezoelectric layer having a first surface and a second surface;
a first conductive region disposed on at least a central portion the first surface of the piezoelectric layer;
a second conductive region disposed on at least a central portion of the second surface of the piezoelectric layer; and
a temperature sensor configured to measure a temperature of at least a portion of the piezoelectric sensor element assembly.

18. The method of claim 17, wherein the actuator is configured to receive an external force, and wherein the spacer is configured to transmit at least a portion of the received external force to at least a portion of the first conductive region of the piezoelectric sensor element assembly.

19. The method of claim 17 wherein the housing comprises at least a portion of the actuator.

20. The method of claim 17, wherein the configurable spacer is characterized by a Young's Modulus in a range of about 0.1 GPa to about 2.0 GPa.

* * * * *